(12) United States Patent
Hong et al.

(10) Patent No.: US 10,861,853 B2
(45) Date of Patent: Dec. 8, 2020

(54) SEMICONDUCTOR DEVICES

(71) Applicant: SAMSUNG ELECTRONICS CO., LTD., Suwon-si (KR)

(72) Inventors: Se Ki Hong, Suwon-si (KR); Ju Youn Kim, Suwon-si (KR); Jin Wook Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/244,324

(22) Filed: Jan. 10, 2019

(65) Prior Publication Data

US 2020/0006341 A1 Jan. 2, 2020

(30) Foreign Application Priority Data

Jun. 27, 2018 (KR) .......................... 10-2018-0073781

(51) Int. Cl.
| | | |
|---|---|---|
| *H01L 27/092* | (2006.01) | |
| *H01L 21/82* | (2006.01) | |
| *H01L 29/66* | (2006.01) | |
| *H01L 21/8238* | (2006.01) | |
| *H01L 29/49* | (2006.01) | |
| *H01L 29/423* | (2006.01) | |
| *H01L 29/78* | (2006.01) | |

(52) U.S. Cl.
CPC .. *H01L 27/0924* (2013.01); *H01L 21/823821* (2013.01); *H01L 21/823828* (2013.01); *H01L 29/42376* (2013.01); *H01L 29/4966* (2013.01); *H01L 29/66545* (2013.01); *H01L 29/66795* (2013.01); *H01L 29/7851* (2013.01)

(58) Field of Classification Search
CPC ... H01L 29/42; H01L 29/423; H01L 29/4237; H01L 29/42376; H01L 29/49; H01L 29/496; H01L 29/4966; H01L 29/66; H01L 29/665; H01L 29/6654; H01L 29/66545; H01L 29/667; H01L 29/6679; H01L 29/66795; H01L 29/78; H01L 29/785; H01L 29/7851; H01L 27/09; H01L 27/092; H01L 27/0924; H01L 21/82; H01L 21/823; H01L 21/8238; H01L 21/82382; H01L 21/823821; H01L 21/823828

USPC ...................................................... 257/369
See application file for complete search history.

(56) References Cited

U.S. PATENT DOCUMENTS

| | | |
|---|---|---|
| 5,450,225 A | 9/1995 | Bostica et al. |
| 9,012,319 B1 | 4/2015 | Choi et al. |
| 9,455,201 B2 | 9/2016 | Joshi et al. |
| 9,831,133 B2 | 11/2017 | Lin et al. |
| 2005/0170667 A1 | 8/2005 | Conley, Jr. et al. |

(Continued)

FOREIGN PATENT DOCUMENTS

| | | |
|---|---|---|
| JP | 2013-051418 A | 3/2013 |
| KR | 10-2016-0099773 A | 8/2016 |

*Primary Examiner* — Monica D Harrison
(74) *Attorney, Agent, or Firm* — Lee IP Law, P.C.

(57) ABSTRACT

A semiconductor device includes a substrate having first and second regions, a first gate electrode layer on the first region, and including a first conductive layer, and a second gate electrode layer on the second region, and including the first conductive layer, a second conductive layer on the first conductive layer, and a barrier metal layer on the second conductive layer, wherein an upper surface of the first gate electrode layer is at a lower level than an upper surface of the second gate electrode layer.

15 Claims, 23 Drawing Sheets

(56) References Cited

U.S. PATENT DOCUMENTS

| | | |
|---|---|---|
| 2005/0265063 A1 | 12/2005 | Forbes |
| 2006/0261404 A1 | 11/2006 | Forbes |
| 2008/0116543 A1 | 5/2008 | Govindarajan |
| 2008/0169485 A1 | 7/2008 | Heyns et al. |
| 2011/0256701 A1 | 10/2011 | Xu et al. |
| 2011/0287620 A1 | 11/2011 | Xu et al. |
| 2013/0049119 A1 | 2/2013 | Huang et al. |
| 2014/0110791 A1 | 4/2014 | Clark |
| 2015/0221489 A1 | 8/2015 | Wollnik et al. |
| 2016/0240630 A1 | 8/2016 | Seong et al. |
| 2016/0284699 A1* | 9/2016 | Jeong .................. H01L 27/0886 |
| 2016/0343706 A1 | 11/2016 | Chang et al. |
| 2017/0162575 A1 | 6/2017 | Li |
| 2017/0186746 A1* | 6/2017 | Chung .................. H01L 27/092 |
| 2019/0165123 A1* | 5/2019 | Lo ..................... H01L 21/28088 |

\* cited by examiner

SEMICONDUCTOR DEVICES

CROSS-REFERENCE TO RELATED APPLICATION

Korean Patent Application No. 10-2018-0073781, filed on Jun. 27, 2018, in the Korean Intellectual Property Office, and entitled: "Semiconductor Devices," is incorporated by reference herein in its entirety.

BACKGROUND

1. Field

The present disclosure relates to semiconductor devices.

2. Description of the Related Art

As demand for high performance, high speed, and/or versatility of semiconductor devices is increased, the degree of integration of semiconductor devices is increasing. With the trend toward higher degree of integration of semiconductor devices, the scaling down of transistors in semiconductor devices is accelerating, and methods are being researched to form transistors with various operating voltages and reduced size. Further, in order to overcome the limitations of the operating characteristics due to the reduction in size of a planar metal oxide semiconductor FET (MOSFET), efforts have been made to develop a semiconductor device including a FinFET having a channel of a three-dimensional structure.

SUMMARY

According to an aspect of embodiments, a semiconductor device includes a substrate having first and second regions, a first gate electrode layer disposed on the first region, and including the first conductive layer, and a second gate electrode layer disposed on the second region, and including a first conductive layer, a second conductive layer disposed on the first conductive layer, and a barrier metal layer disposed on the second conductive layer, wherein an upper surface of the first gate electrode layer is located on a lower level than an upper surface of the second gate electrode layer.

According to another aspect of embodiments, a semiconductor device includes a substrate having first and second regions, a first gate electrode layer disposed on the first region, and including a first conductive layer, and a second gate electrode layer disposed on the second region, and including the first conductive layer and a second conductive layer disposed on the first conductive layer and having a work function lower than that of the first conductive layer, wherein the first conductive layer in the first gate electrode layer has a substantially constant width, and the second conductive layer in the second gate electrode layer has a shape in which a width of an upper portion is wider than a width of a lower portion.

According to yet another aspect of embodiments, a semiconductor device includes a semiconductor substrate having first and second regions with impurities of the same conductivity type, a first gate electrode layer disposed on the first region, and including a first conductive layer, and a second gate electrode layer disposed on the second region, and including the first conductive layer and a second conductive layer disposed on the first conductive layer, wherein the second gate electrode layer has a greater thickness than the first gate electrode layer, and a first transistor including the first gate electrode layer has an operating voltage different from that of a second transistor including the second gate electrode layer.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments of the present disclosure will be described with reference to the accompanying drawings.

Figure 1:
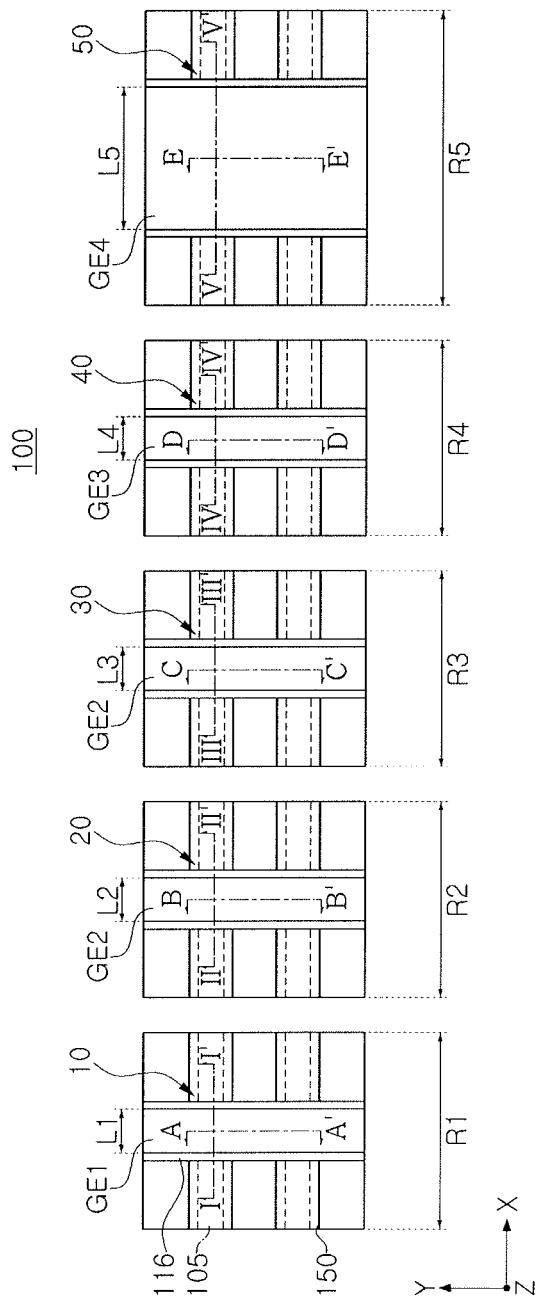
FIG. 1 illustrates a plan view of semiconductor devices according to example embodiments.
Figure 2A:
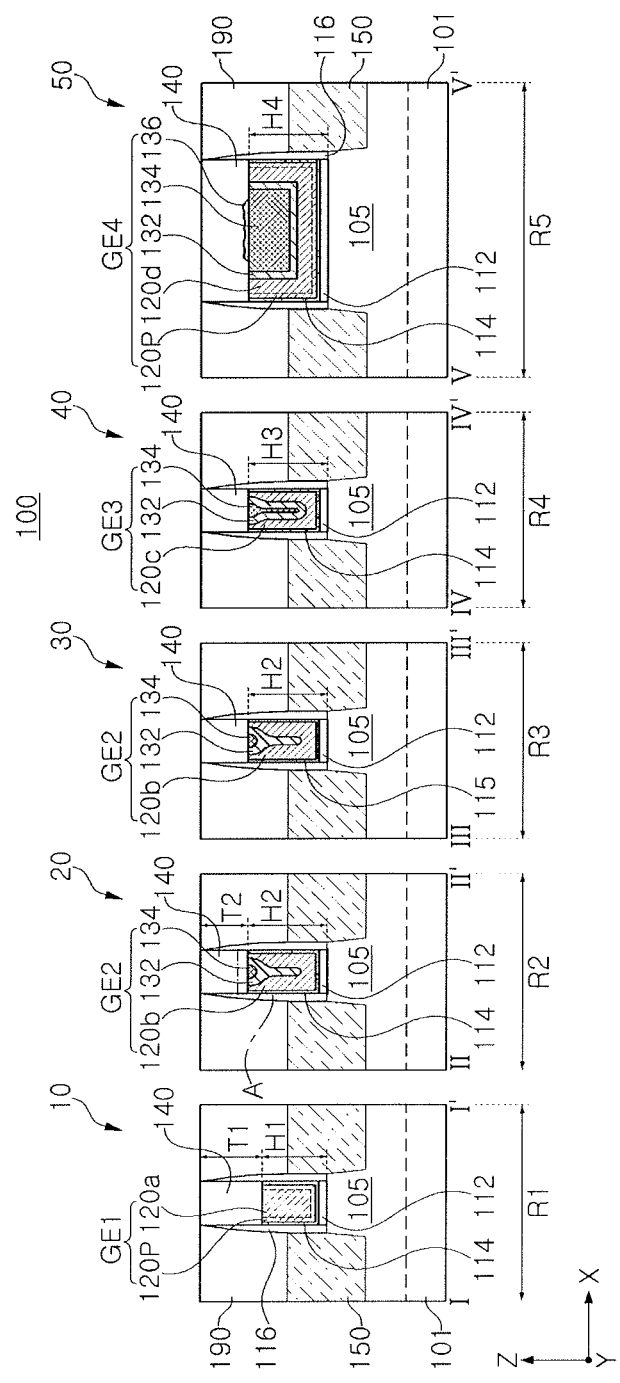
FIG. 2A illustrates a cross-sectional view of the semiconductor devices of FIG. 1 along lines I-I', IV-IV', and V-V', respectively.
Figure 2B:
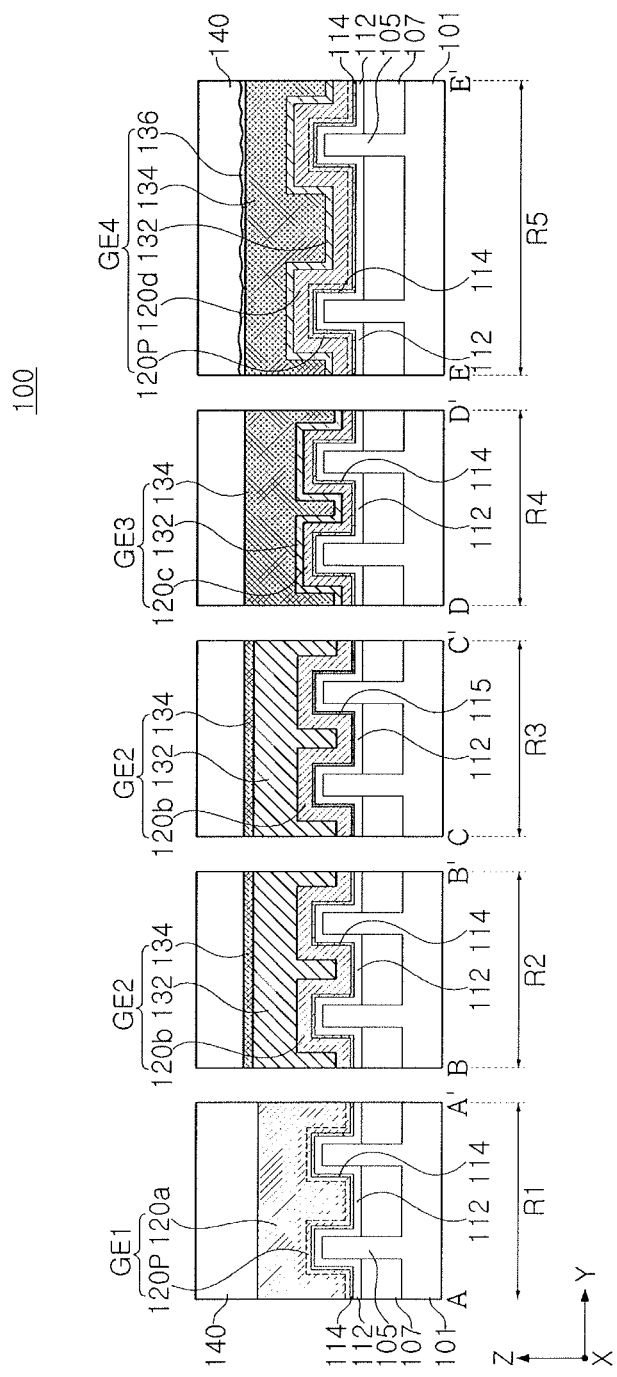
FIG. 2B illustrates a cross-sectional view of the semiconductor devices of FIG. 1 along lines A-A', B-B', C-C', D-D', and E-E', respectively.

FIG. 1 is a plan view illustrating semiconductor devices according to example embodiments. FIG. 2A is a cross-sectional view illustrating semiconductor devices of FIG. 1 cut along lines I-I', IV-IV', and V-V', respectively. FIG. 2B is a cross-sectional view illustrating semiconductor devices of FIG. 1 cut along lines A-A', B-B', C-C', D-D', and E-E', respectively. For convenience of explanation, only main components of a semiconductor device are illustrated in FIGS. 1, 2A, and 2B.

Referring to FIGS. 1, 2A, and 2B, a semiconductor device 100 may include a substrate 101 having first to fifth regions R1, R2, R3, R4, and R5, active fins 105, source/drain regions 150, interface layers 112, first and second gate dielectric layers 114 and 115, gate spacer layers 116, and first to fourth gate electrode layers GE1, GE2, GE3, and GE4. The semiconductor device 100 may further include isolation layers 107, a gate capping layer 140, and an interlayer insulating layer 190.

The semiconductor device 100 may include Fin Field-effect transistor (FinFET) elements in which the active fins 105 have a fin structure. The FinFET elements may include first to fifth transistors 10, 20, 30, 40, and 50 arranged around the active fins 105 and the first to fourth gate electrode layers GE1, GE2, GE3, and GE4, which cross each other. For example, the first to fifth transistors 10, 20, 30, 40, and 50 may all be p-type metal-oxide-semiconductor (MOS) field effect transistors (MOSFETs). The first to fifth transistors 10, 20, 30, 40, and 50 may be transistors to be driven under different threshold voltages from each other, and may constitute the same or different circuits in the semiconductor device 100.

The substrate 101 may have different first to fifth regions R1, R2, R3, R4, and R5. The first to fifth regions R1, R2, R3, R4, and R5 may be regions in which the first to fifth transistors 10, 20, 30, 40, and 50 are disposed, respectively. The first to fifth regions R1, R2, R3, R4, and R5 may be disposed to be spaced apart from each other or disposed adjacent to each other in the semiconductor device 100.

The substrate 101 may have an upper surface extending in X and Y directions. The substrate 101 may include a semiconductor material, e.g., a Group IV semiconductor, a Group III-V compound semiconductor, or a Group II-VI compound semiconductor. For example, the Group IV semiconductor may include silicon, germanium, or silicon-germanium. The substrate 101 may be provided, e.g., as a bulk wafer, an epitaxial layer, a silicon-on-insulator (SOI) layer, or a semiconductor-on-insulator (SeOI) layer, or the like.

Isolation layers 107 may define the active fins 105 in the substrate 101, as illustrated in FIG. 2B. The isolation layers 107 may be formed, e.g., by a shallow trench isolation (STI) process. According to embodiments, the isolation layers 107 may include a region that extends deeper into a lower portion of the substrate 101 between adjacent active fins 105. According to the embodiments, the isolation layers 107 may have a curved upper surface having a relatively higher level closer to the active fins 105, but shapes of upper and lower surfaces of the isolation layers 107 are not limited to those illustrated in the figures. The isolation layers 107 may be made of an insulating material. The isolation layers 107 may be, e.g., an oxide, a nitride, or a combination thereof.

The active fins 105 may be defined by the isolation layers 107 in the substrate 101, and may be arranged to extend in one direction, e.g., in the X direction. The active fins 105 may have a linear or bar shape, e.g., extending in the X direction (FIG. 1), and may protrude from, e.g., above, the substrate 101 between the isolation layers 107, e.g., to have a width in the Y direction (FIG. 2B). Although FIG. 1 illustrates a pair of active fins 105 disposed in the first to fifth regions R1, R2, R3, R4, and R5, respectively, the configuration and number of the active fins 105 are not limited thereto. For example, one or three or more of active fins 105 may be disposed in each of the first to fifth regions R1, R2, R3, R4, and R5.

The active fins 105 may be a portion of the substrate 101, and may include an epitaxial layer grown from the substrate 101. As illustrated in FIG. 2A, the active fins 105 may be partially recessed on both sides of the first to fourth gate electrode layers GE1, GE2, GE3, and GE4, and the source/drain regions 150 may be disposed on the recessed active fins 105. For example, as illustrated in FIG. 1, each of the first to fourth gate electrode layers GE1, GE2, GE3, and GE4 may extend in the Y direction to intersect the active fins 105, and two source/drain regions 150 may be disposed on, e.g., each of, the recessed active fins 105 on opposite sides of each of the first to fourth gate electrode layers GE1, GE2, GE3, and GE4 (FIG. 2A). Therefore, as illustrated in FIG. 2B, the active fins 105 may have a relatively high height on a lower portion of the first to fourth gate electrode layers GE1, GE2, GE3, and GE4. In example embodiments, the active fins 105 may include impurities.

The source/drain regions 150 may be disposed on the active fins 105 on both sides of, e.g., each of, the first to fourth gate electrode layers GE1, GE2, GE3, and GE4. The source/drain regions 150 may be provided as a source region or a drain region of the first to fifth transistors 10, 20, 30, 40, and 50. The source/drain regions 150 may have an elevated source/drain shape of which an upper surface is positioned to be higher than lower surfaces of the first to fourth gate electrode layers GE1, GE2, GE3, and GE4. According to embodiments, the source/drain regions 150 may be connected to each other, or may be merged on two or more active fins 105 to form one source/drain region 150.

The source/drain regions 150 may be formed of an epitaxial layer and may include impurities. For example, the source/drain regions 150 may include p-type doped silicon germanium (SiGe). When the source/drain regions 150 include silicon germanium (SiGe), stress may be subjected to a channel region of the first to fifth transistors 10, 20, 30, 40, and 50, which is part of the active fins 105 formed of silicon (Si), to improve the mobility of holes. In example embodiments, the source/drain regions 150 may include a plurality of regions having different concentrations of elements and/or doping elements.

The interface layers 112 and the first and second gate dielectric layers 114 and 115 may be arranged between the active fins 105 and the first to fourth gate electrode layers GE1, GE2, GE3, and GE4. The first gate dielectric layers 114 may be disposed in the first, second, fourth, and fifth regions R1, R2, R4, and R5, and the second gate dielectric layer 115 may be disposed in the third region R3. The first and second gate dielectric layers 114 and 115 may be disposed to cover the lower surface and both side surfaces of the first to fourth gate electrode layers GE1, GE2, GE3, and GE4. In example embodiments, the first and second gate dielectric layers 114 and 115 may be formed only on the lower surfaces of the first to fourth gate electrode layers GE1, GE2, GE3, and GE4.

The interface layers 112 may be made of a dielectric material, e.g., a silicon oxide film, a silicon oxynitride, or a combination thereof. The first and second gate dielectric layers 114 and 115 may include an oxide, a nitride, or a high-k material. The high-k material may refer to a dielectric material having a dielectric constant higher than that of the silicon oxide ($SiO_2$). The high dielectric constant material may be any one of aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). The first gate dielectric layer 114 and the second gate dielectric layer 115 may include different materials from each other. The second gate dielectric layer 115 may be made of the same material as the first gate dielectric layer 114, and may further include an element which serves to increase a threshold voltage of a transistor. For example, the second gate dielectric layer 115 may further include a rare earth element, e.g., lanthanum (La), gadolinium (Gd), ruthenium (Lu), yttrium (Y), and scandium (Sc). These elements may increase a threshold voltage, e.g., by forming electrical dipoles.

The gate spacer layers 116 may be disposed on both sides of the first to fourth gate electrode layers GE1, GE2, GE3, and GE4. The gate spacer layers 116 may insulate the source/drain regions 150 from the first to fourth gate electrode layers GE1, GE2, GE3, and GE4. The gate spacer layers 116 may be multilayer structures, according to embodiments. The gate spacer layers 116 may be made of an oxide, a nitride or an oxynitride, and may, in particular, be formed as a low dielectric film.

The first to fourth gate electrode layers GE1, GE2, GE3, and GE4 may be disposed to cross the active fins 105 on upper portions of the active fins 105 and extend in one direction, e.g., in the Y direction. The channel regions of the first to fifth transistors 10, 20, 30, 40, and 50 may be formed in the active fins 105 intersecting the first to fourth gate electrode layers GE1, GE2, GE3, and GE4. The first gate electrode layer GE1 may be disposed in the first region R1, the second gate electrode layer GE2 may be disposed in the second and third regions R2 and R3, the third gate electrode layer GE3 may be disposed in the fourth region R4, and the fourth gate electrode layer GE4 may be disposed in the fifth region R5. The first to fourth gate electrode layers GE1, GE2, GE3, and GE4 may have first to fifth lengths L1, L2, L3, L4, and L5, respectively, in the first to fifth regions R1, R2, R3, R4, and R5 in a channel direction, i.e., in the X direction. The first to fifth lengths L1, L2, L3, L4 and L5 may be equal to or correspond to the channel lengths of the first to fifth transistors 10, 20, 30, 40 and 50. The first to fourth lengths L1, L2, L3, and L4 may be substantially the same or similar to each other, and may be shorter than the fifth length L5. For example, the first to fourth lengths L1, L2, L3, and L4 may have a range of 50 nm or less, and the fifth length L5 may have a range of 50 nm to 300 nm.

The first to fourth gate electrode layers GE1, GE2, GE3, and GE4 may include first, second, third, and fourth conductive layers 120a, 120b, 120c, and 120d, respectively, which vary in thickness. In detail, the first gate electrode layer GE1 may include a preliminary first conductive layer 120P and the first conductive layer 120a. The second gate electrode layer GE2 may include the second conductive layer 120b, a fifth conductive layer 132, and a barrier metal layer 134. The third gate electrode layer GE3 may include the third conductive layer 120c, the fifth conductive layer 132, and the barrier metal layer 134. The fourth gate electrode layer GE4 may include the preliminary first conductive layer 120P, the fourth conductive layer 120d, the fifth conductive layer 132, the barrier metal layer 134, and an upper metal layer 136. The relative thicknesses of each of the layers in the first to fourth gate electrode layers GE1, GE2, GE3, and GE4 are not limited to those illustrated in the figures, and may be variously changed in embodiments.

An upper surface of the first gate electrode layer GE1 may be located at a first height H1 along the Z direction from an upper surface of the active fin 105. Upper surfaces of the second to fourth gate electrode layers GE2, GE3, and GE4 may be located at second to fourth heights H2, H3 and H4 along the Z direction from the upper surface of the active fin 105. The second and third heights H2 and H3 may be higher than the first height H1. The fourth height H4 may also be higher than the first height H1, but is not limited thereto. For example, the upper surface of the first gate electrode layer GE1 may be located on a level lower than the upper surfaces of the second to fourth gate electrode layers GE2, GE3, and GE4. Therefore, a thickness of the first gate electrode layer GE1 may be lower than thicknesses of the second to fourth gate electrode layers GE2, GE3, and GE4. The second and third heights H2 and H3 may be substantially the same, and the fourth height 114 may be the same or similar to the second and third heights H2 and H3, but are not limited thereto. For example, the fourth height H4 may be lower than the second and third heights H2 and H3.

The first through fourth conductive layers 120a, 120b, 120c, and 120d may have a first work function, and may be, e.g., layers containing a metal element. The first through fourth conductive layers 120a, 120b, 120c, and 120d may be made of the same material, and may have different thicknesses from each other. The first through fourth conductive layers 120a, 120b, 120c, and 120d may include a material having a higher work function than the fifth conductive layer 132. For example, each of the first through fourth conductive layers 120a, 120b, 120c, and 120d may include TiN, TaN, W, WCN, or a combination thereof. The preliminary first conductive layer 120P may be formed of the same material as the first through fourth conductive layers 120a, 120b, 120c, and 120d, but may be slightly different in crystallinity and physical properties due to heat treatment, thereby a boundary with the first and fourth conductive layers 120a and 120d may be distinguished.

In the first gate electrode layer GE1, the first conductive layer 120a may be disposed on the preliminary first conductive layer 120P, and may completely fill a space defined by the first gate dielectric layer 114 and the gate capping layer 140, together with the preliminary first conductive layer 120P. For example, as illustrated in FIG. 2A, the first conductive layer 120a may have a constant width along the X direction. The first conductive layer 120a may have a flat upper surface, and the upper surface may contact the gate capping layer 140.

In the second gate electrode layer GE2, the second conductive layer 120b may be disposed on the first and second gate dielectric layers 114 and 115 in the second and third regions R2 and R3, respectively. The second conductive layer 120b may be arranged in a U-shape or a similar shape, and may not completely fill a space defined by the first and second gate dielectric layers 114 and 115, and the gate capping layer 140. For example, as illustrated in FIG. 2A, the second conductive layer 120b may cover a bottom and inner sidewalls of each of the first and second gate dielectric layers 114 and 115, and may leave a space in a center thereof for the fifth conductive layer 132. The second conductive layer 120b may include a region in an upper portion having a lower thickness than in a lower portion, e.g., a total width of a top of the second conductive layer 120b in the X direction may be smaller than a total width of a bottom of the second conductive layer 120b (FIG. 2A). The thickness may refer to a thickness, e.g., distance, measured from sides, e.g., the inner sidewalls, of the first and second gate dielectric layers 114 and 115. The second conductive layer 120b may have a curved upper surface (e.g., an outer surface facing the fifth conductive layer 132), and may have an upper surface having a concave area, as illustrated.

In the third gate electrode layer GE3, the third conductive layer 120c may be disposed on the first gate dielectric layer 114, may be arranged in a U-shape or a similar shape, and may not completely fill a space defined by the first gate dielectric layer 114 and the gate capping layer 140. The third conductive layer 120c may include a region in an upper portion having a lower thickness than in a lower portion thereof. Particularly, the third conductive layer 120c may have a lower thickness than the second conductive layer 120b of the second gate electrode layer GE2, in the upper region having a relatively great thickness, e.g., a total width of a top of the second conductive layer 120b in the X direction may be larger than a total width of a top of the third conductive layer 120c (FIG. 2A). The third conductive layer 120c may have a curved upper surface, and may have an upper surface having a concave area.

In the fourth gate electrode layer GE4, the fourth conductive layer 120d may be conformally disposed on the preliminary first conductive layer 120P, and may not completely fill a space defined by the first gate dielectric layer 114 and the gate capping layer 140. The fourth conductive layer 120d may have a greater thickness than, e.g., each of, the second and third conductive layers 120b and 120c of the second and third gate electrode layers GE2 and GE3. The fourth conductive layer 120d may have a stepped upper surface, and may have an upper surface having a concave area.

The fifth conductive layer 132 may have a second work function lower than the first work function, and may be, e.g., a layer containing a metal element. For example, the fifth conductive layer 132 may include an alloy including aluminum (Al), a conductive metal carbide including Al, a conductive metal nitride including Al, or a combination thereof, and may include TiAl, TiAlC, TiAlN, or combinations thereof.

The fifth conductive layer 132 in the second and third gate electrode layers GE2 and GE3 may be disposed on the second and third conductive layers 120b and 120c, and may have a curved upper surface having a concave area. The fifth conductive layer 132 may be conformally formed along the second and third conductive layers 120b and 120c, e.g., along the outer curved surfaces of each of the second and third conductive layers 120b and 120c. For example, since the top width of each of the second and third conductive layers 120b and 120c is smaller than a corresponding bottom width, the conformal structure of the fifth conductive layer 132 in the top may define the concave area in the top center of each of the second and third gate electrode layers GE2 and GE3.

In detail, in the second gate electrode layer GE2, the fifth conductive layer 132 may be configured to, e.g., completely, fill a space between facing surfaces of the lower portion, e.g., bottom, of the second conductive layer 120b due to a relatively narrow space, e.g., the fifth conductive layer 132 may have a Y-shape. In the third gate electrode layer GE3, the fifth conductive layer 132 may be configured to, e.g., only partially, fill a space between facing surfaces of the lower portion, e.g., bottom, of the third conductive layer 120c due to a wider space than in the second gate electrode layer GE2, e.g., the fifth conductive layer 132 may have a U-shape. Therefore, the fifth conductive layer 132 in the second and third gate electrode layers GE2 and GE3 may have a U-shape, a Y-shape, or their similar shape. The fifth conductive layer 132 may have a shape in which a width of an upper portion is wider than a width of a lower portion. In this case, the width may refer to a distance from one end to the other end in the X direction (e.g., between opposite ends of the fifth conductive layer 132 in the X direction), and may refer to a distance between the both, e.g., opposite, ends of the fifth conductive layer 132 including the barrier metal layer 134 therebetween, in an upper area of the fifth conductive layer 132.

The fifth conductive layer 132 in the fourth gate electrode layer GE4 may be conformally disposed on the fourth conductive layer 120d. The fifth conductive layer 132 in the fourth gate electrode layer GE4 may not completely fill a space between facing surfaces of the fourth conductive layer 120d, e.g., the fifth conductive layer 132 in the fourth gate electrode layer GE4 may have a U-shape along an outer surface of the fourth conductive layer 120d (FIG. 2A).

The barrier metal layer 134 may include different materials from those of the fifth conductive layer 132, and may include, e.g., TiN, TaN, W, WCN, or combinations thereof. The upper metal layer 136 may include different materials from those of the barrier metal layer 134, and may include, e.g., TiN, TaN, W, WCN, or combinations thereof. The barrier metal layer 134 and the upper metal layer 136 are not necessarily made of a metal material, but may be made of a semiconductor material, e.g., polysilicon, according to embodiments.

The barrier metal layer 134 in the second and third gate electrode layers GE2 and GE3 may be disposed on the fifth conductive layer 132, and may completely fill the concave area between the fifth conductive layer 132, e.g., the barrier metal layer 134 may completely fill the concave area defined by the fifth conductive layer 132 in the upper portion of the second and third gate electrode layers GE2 and GE3. The barrier metal layer 134 may have a flat upper surface in contact with the gate capping layer 140. The barrier metal layer 134 in the second and third gate electrode layers GE2 and GE3 may have a narrower width in the lower portion than in the upper portion. Particularly, the barrier metal layer 134 in the third gate electrode layer GE3 may have a relatively thin and long protrusion in the lower portion. The specific shape of the barrier metal layer 134 in the second and third gate electrode layers GE2 and GE3 may be varied depending on the second to fourth lengths L2, L3, and L4 of the second and third gate electrode layers GE2 and GE3, the thickness of the second through fifth conductive layers 120b, 120c, 120d, and 132, or the like.

In the fourth gate electrode layer GE4, the barrier metal layer 134 may almost or completely fill a space between facing surfaces of the fifth conductive layer 132. The upper metal layer 136 may be disposed on at least the barrier metal layer 134 in the fourth gate electrode layer GE4, and may extend to upper portions of the fifth conductive layer 132 and the fourth conductive layer 120d. The upper metal layer 136 may have a non-uniform thickness, but is not limited thereto.

The first to fifth transistors 10, 20, 30, 40, and 50 may all be MOSFETs of the same conductivity type, may have different threshold voltages from each other, and accordingly, have different operating voltages from each other. For example, the first to fifth transistors 10, 20, 30, 40, and 50 may all be p-type MOSFETs. The first transistor 10 may have the lowest threshold voltage and operating voltage, and the second transistor 20 may have a threshold voltage and operating voltage higher than those of the first transistor 10. The third transistor 30 may have a threshold voltage and an operating voltage higher than those of the second transistor 20, and the fourth transistor 40 may have a threshold voltage and operating voltage higher than those of the third transistor 30. The fifth transistor 50 may have a threshold voltage and an operating voltage higher than those of the fourth transistor 40. In this specification, a magnitude of the threshold voltage and the operating voltage may be compared in an absolute value. A difference in a threshold voltage and an operating voltage between the first, second, and fourth transistors 10, 20, and 40 may be determined by a difference in a structure of the first to third gate electrode layers GE1, GE2, and GE3. Also, a difference in a threshold voltage and an operating voltage between the second and third transistors 20 and 30 may be due to a difference between the first gate dielectric layer 114 and the second gate dielectric layer 115.

In an embodiment in which the first through fourth conductive layers 120a, 120b, 120c, and 120d are made of TiN and the fifth conductive layer 132 is made of TiAlC, a threshold voltage in the structure of the first transistor 10 was reduced by about 47 mV, as compared with a threshold voltage in the structure of the second transistor 20. In addition, a threshold voltage in a structure of a transistor including the first gate electrode layer GE1 and the second gate dielectric layer 115 was reduced by about 60 mV, as compared with the structure of the third transistor 30. From this, it can be seen that the threshold voltage of the p-type MOSFET may be relatively reduced in a case of having the first gate electrode layer GE1 without the fifth conductive layer 132.

In example embodiments, the semiconductor device 100 may further include a sixth transistor having the second gate dielectric layer 115 and the third gate electrode layer GE3 and/or a seventh transistor having the second gate dielectric layer 115 and the fourth gate electrode layer GE4. In this case, the sixth transistor may have a threshold voltage and an operating voltage higher than those of the fourth transistor 40, and the seventh transistor may have a threshold voltage and an operating voltage higher than those of the fifth transistor 50. Even in the case of a transistor having a relatively long channel length, four or more transistors having different threshold voltages and operating voltages may be provided through adjusting combinations of the first and second gate dielectric layers 114 and 115 and the first through fifth conductive layers 120a, 120b, 120c, 120d, and 132, similarly to the first to fourth transistors 10, 20, 30, and 40.

In example embodiments, the semiconductor device 100 may not include at least one of the second to fifth transistors 20, 30, 40, and 50. For example, the semiconductor device 100 may include only the first and second transistors 10 and 20, or may include only the first and fourth transistors 10 and 40. As described above, the types of the transistors included in the semiconductor device 100 may be variously selected depending on a range of operating voltages required in the semiconductor device 100.

The gate capping layer 140 may be disposed to fill an area between the gate spacer layers 116 on the first to fourth gate electrode layers GE1, GE2, GE3, and GE4. The gate capping layer 140 may have a first thickness T1 on the first gate electrode layer GE1, and may have a second thickness T2, greater than the first thickness T1, on the second to fourth gate electrode layers GE2, GE3, and GE4 (FIG. 2A). According to embodiments, a thickness of the gate capping layer 140 may be variously changed.

The interlayer insulating layer 190 may be disposed to cover the upper surfaces of the isolation layers 107, the source/drain regions 150, and the first to fourth gate electrode layers GE1, GE2, GE3, and GE4. The interlayer insulating layer 190 may include at least one of, e.g., an oxide, a nitride, and an oxynitride, and may include a low dielectric material.

Figure 3A:
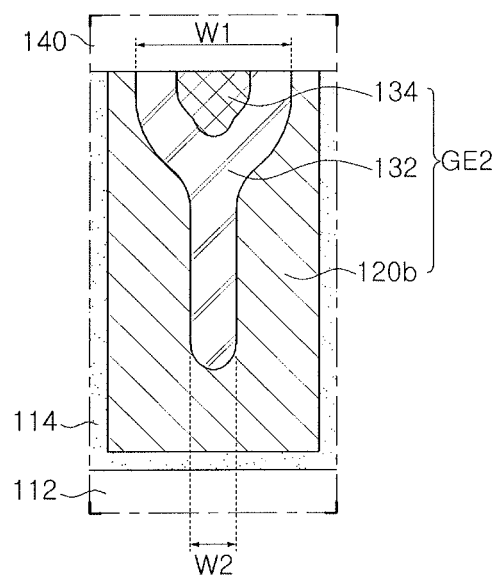
FIGS. 3A to 3C illustrate partially enlarged views of a portion of a semiconductor device according to example embodiments.
Figure 3B:
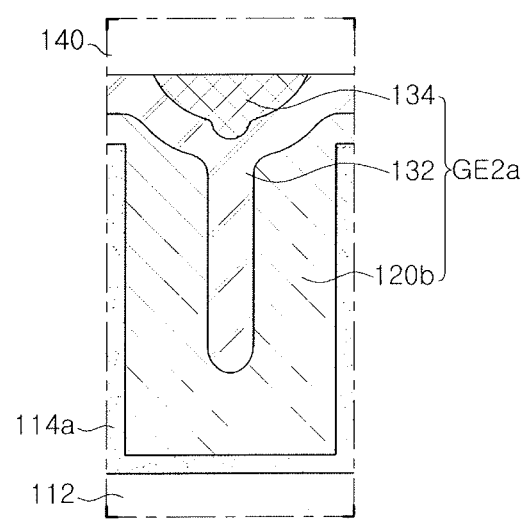
Figure 3C:
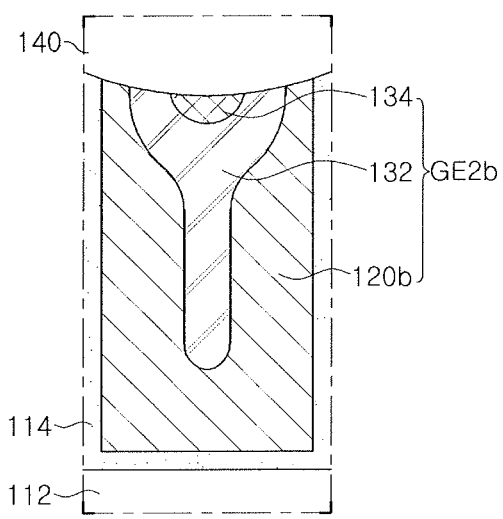

FIGS. 3A to 3C are partially enlarged views illustrating a portion of semiconductor devices according to example embodiments. FIGS. 3A to 3C illustrate regions corresponding to region 'A' in FIG. 2A.

Referring to FIG. 3A, the second gate electrode layer GE2 of FIG. 2A is illustrated in an enlarged scale. The second gate electrode layer GE2 may have an upper surface at the same height as the first gate dielectric layer 114.

In the second gate electrode layer GE2, the fifth conductive layer 132 may have a first width W1 in an upper region, and a second width W2, narrower than the first width W1, in a lower region. The barrier metal layer 134 may be disposed to be surrounded by the fifth conductive layer 132 at the upper portion of the fifth conductive layer 132. The barrier metal layer 134 may also have a width at the upper portion wider than a width at the lower portion. The barrier metal layer 134 may be disposed only in regions in which the fifth conductive layer 132 has a relatively wide width, and may not extend downwardly.

Referring to FIG. 3B, a second gate electrode layer GE2a may have an upper surface located on a higher level than an upper surface of a first gate dielectric layer 114a. The second conductive layer 120b of the second gate electrode layer GE2a may cover the upper surface of the first gate dielectric layer 114a in an edge region of the second gate electrode layer GE2a. Therefore, profiles of the fifth conductive layer 132 and the barrier metal layer 134 may be correspondingly changed.

A reduced height of the first gate dielectric layer 114a may be formed such that a portion of the first gate dielectric layer 114a is etched together with first and second layers 122 and 124 during a process to be described below with reference to FIG. 9H.

Referring to FIG. 3C, a second gate electrode layer GE2b may have a non-flat upper surface, unlike in FIGS. 3A and 3B. The second gate electrode layer GE2b may have a curved upper surface, and the gate capping layer 140 may have a concave upper surface having a greater thickness toward a central portion. The shape of the upper surface of the second gate electrode layer GE2b may be formed by varying the etching rate due to a flow of an etchant varied depending on regions during a process described below with reference to FIG. 9L.

As described above with reference to FIGS. 3A to 3C, the shapes of the respective layers constituting the second gate electrode layer GE2 and the shapes of the peripheral layers may be variously changed in embodiments. Similarly, in the other gate electrode layers GE1, GE3, and GE4 described above with reference to FIG. 2A, the shapes of the respective layers constituting the gate electrode layers GE1, GE3, and GE4, and relative configuration with the peripheral layers may be variously changed in embodiments.

Figure 4:
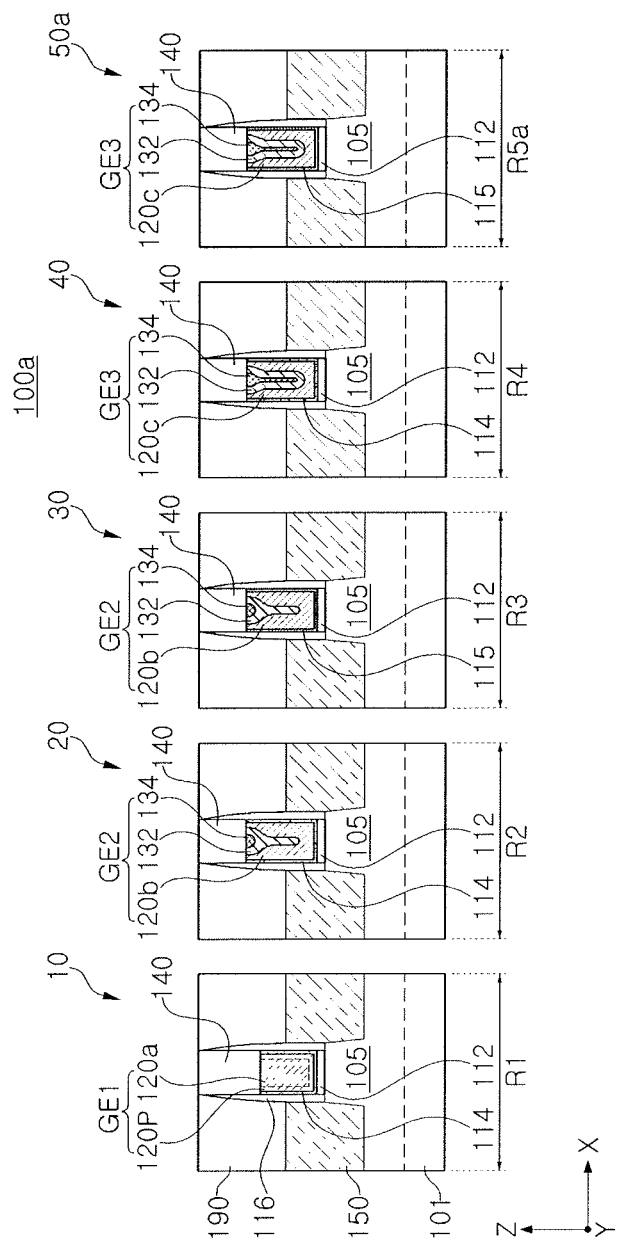
FIGS. 4 and 5 illustrate cross-sectional views of semiconductor devices according to example embodiments.
Figure 5:
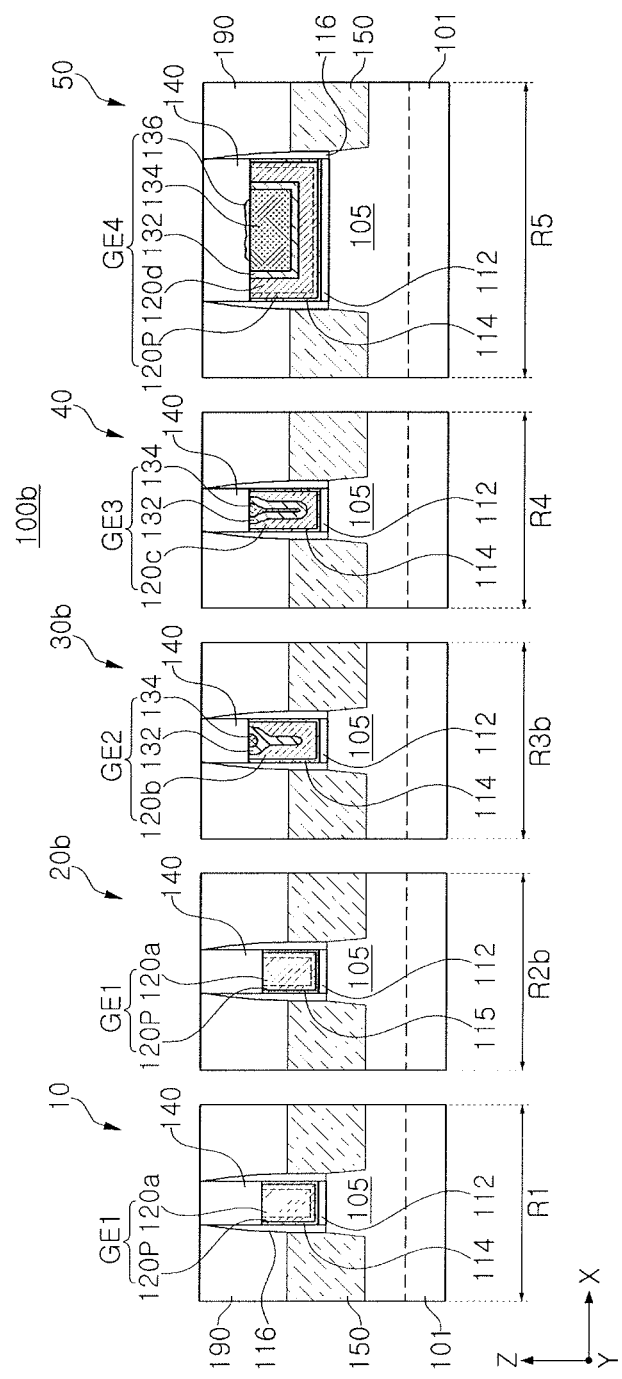

FIGS. 4 and 5 are cross-sectional views illustrating semiconductor devices according to example embodiments.

Referring to FIG. 4, in a semiconductor device 100a, the substrate 101 may have first to fifth regions R1, R2, R3, R4, and R5a. The semiconductor device 100a may include first to fifth transistors 10, 20, 30, 40, and 50a disposed in the first to fifth regions R1, R2, R3, R4, and R5a, and including first to third gate electrode layers GE1, GE2, and GE3, respectively.

The first to fourth transistors 10, 20, 30, and 40 may be the same as the first to fourth transistors 10, 20, 30, and 40 of FIG. 2A, respectively. Therefore, it can be understood that the semiconductor device 100a includes the fifth transistor 50a instead of the fifth transistor 50, as compared with the semiconductor device 100 in FIG. 2A. According to embodiments, the semiconductor device 100a may further include the fifth transistor 50 of FIG. 2A.

The first to fifth transistors 10, 20, 30, 40, and 50a may all be p-type MOSFETs. The first to fifth transistors 10, 20, 30, 40, and 50a may have different threshold voltages from each other, and thus may have different operating voltages from each other. The fifth transistor 50a may have a higher threshold voltage and a higher operating voltage than the fourth transistor 40. Therefore, the threshold voltage and the operating voltage may be increased from the first transistor 10 to the fifth transistor 50a.

The fifth transistor 50a may have the same gate electrode layer GE3 as the fourth transistor 40. The fifth transistor 50a may have the second gate dielectric layer 115, unlike the fourth transistor 40. Therefore, the fifth transistor 50a may have a higher threshold voltage and a higher operating voltage than the fourth transistor 40.

Referring to FIG. 5, in a semiconductor device 100b, the substrate 101 may have first to fifth regions R1, R2b, R3b, R4, and R5. The semiconductor device 100b may include first to fifth transistors 10, 20b, 30b, 40, and 50 disposed in the first to fifth regions R1, R2b, R3b, R4, and R5, and including first to fourth gate electrode layers GE1, GE2, GE3, and GE4, respectively.

The first, fourth, and fifth transistors 10, 40, and 50 may be identical to the first, fourth, and fifth transistors 10, 40, and 50 of FIG. 2A, respectively, and the third transistor 30b may be the same as the second transistor 20 of FIG. 2A. Therefore, it can be understood that the semiconductor device 100b includes the second transistor 20b instead of the third transistor 30 of FIG. 2A, as compared with the semiconductor device 100 of FIG. 2A. According to embodiments, the semiconductor device 100b may further include the fifth transistor 50a of FIG. 4.

The first to fifth transistors 10, 20b, 30b, 40, and 50 may all be p-type MOSFETs. The first to fifth transistors 10, 20b, 30b, 40, and 50 may have different threshold voltages from each other, and thus may have different operating voltages from each other. The first transistor 10 may have the lowest threshold voltage and operating voltage, and the second transistor 20b may have a threshold voltage and an operating voltage higher than those of the first transistor 10. The third transistor 30b may have a threshold voltage and an operating voltage higher than those of the second transistor 20b, and the fourth transistor 40 may have a threshold voltage and an operating voltage higher than those of the third transistor 30b. The fifth transistor 50 may have a threshold voltage and an operating voltage higher than those of the fourth transistor 40.

The second transistor 20b may have the same gate electrode layer GE1 as the first transistor 10. The second transistor 20b may have the second gate dielectric layer 115, unlike the first transistor 10. Therefore, the second transistor 20b may have a threshold voltage and an operating voltage higher than those of the first transistor 10.

Figure 6:
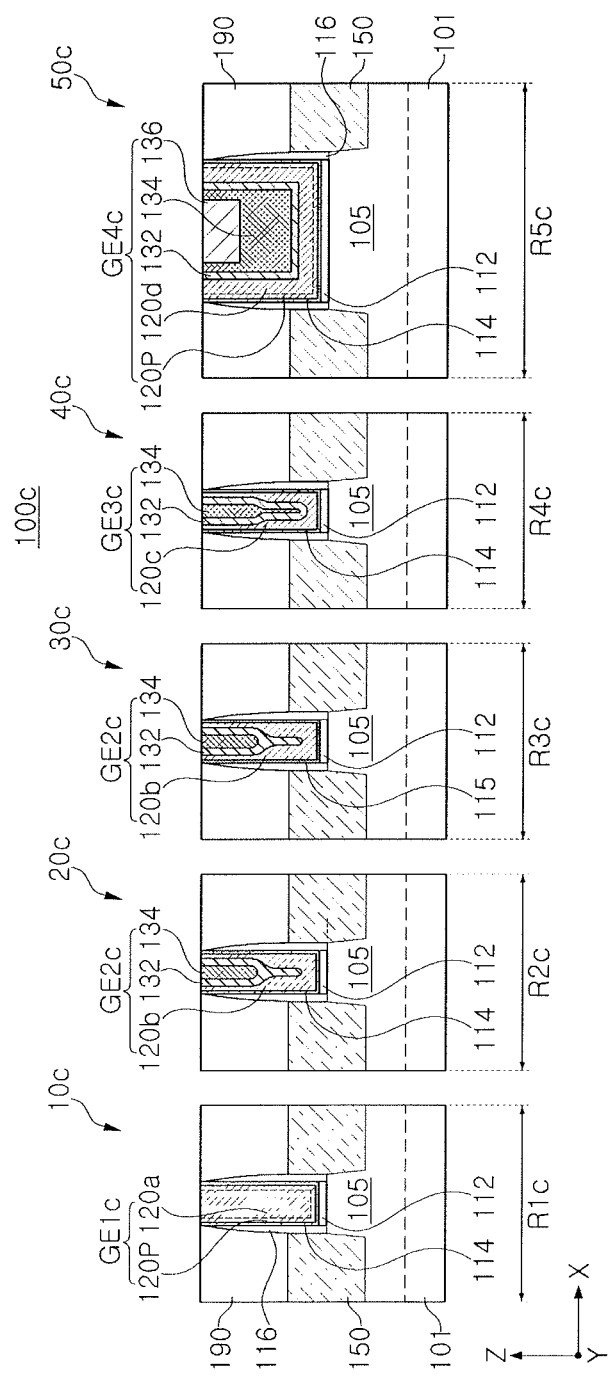
FIG. 6 illustrates a cross-sectional view of semiconductor devices according to example embodiments.

FIG. 6 is a cross-sectional view illustrating semiconductor devices according to example embodiments.

Referring to FIG. 6, a semiconductor device 100c may not include the gate capping layer 140, unlike the semiconductor device 100 of FIG. 2A. Therefore, first to fourth gate electrode layers GE1c, GE2c, GE3c, and GE4c in first to fifth transistors 10c, 20c, 30c, 40c, and 50c may have a relatively great thickness than in the semiconductor device 100 of FIG. 2A.

The barrier metal layers 134 in the second and third gate electrode layers GE2c and GE3c may be arranged long in a vertical direction at a central portion. An upper metal layer 136 in the fourth gate electrode layer GE4c may be arranged to fill a space between facing surfaces of the barrier metal layer 134 at a central portion thereof. Thus, in example embodiments, the gate capping layer 140 may be disposed in various thicknesses, and may be omitted.

Figure 7:
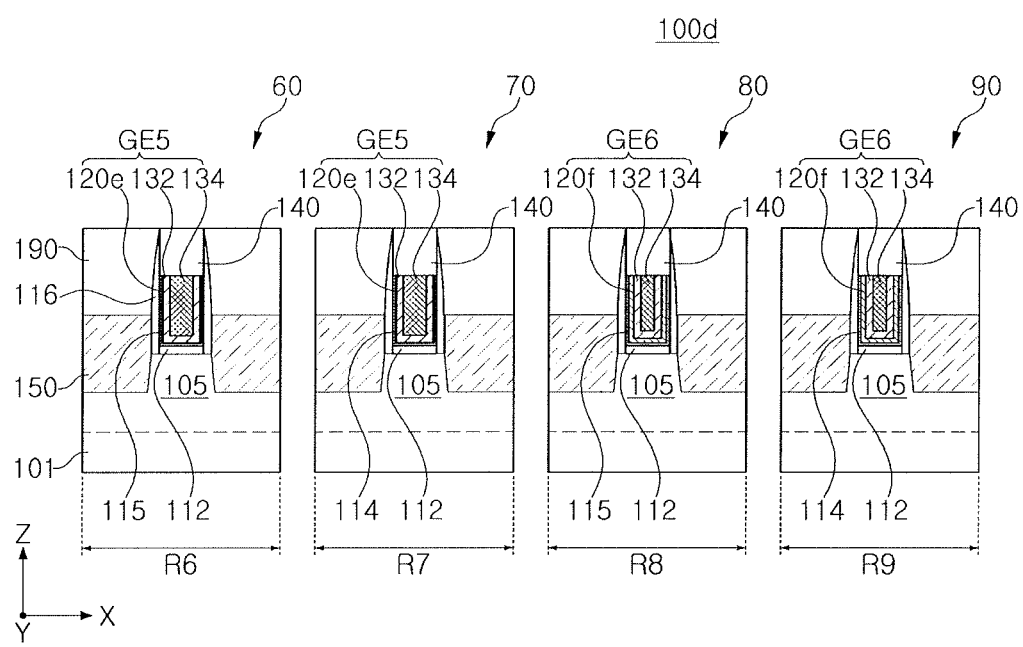
FIG. 7 illustrates a cross-sectional view of semiconductor devices according to example embodiments.

FIG. 7 is a cross-sectional view illustrating semiconductor devices according to example embodiments.

Referring to FIG. 7, a semiconductor device 100d may include the substrate 101 having sixth to ninth regions R6, R7, R8, and R9, the active fins 105, the source/drain regions 150, the first and second gate dielectric layers 114 and 115, the gate spacer layers 116, and fifth and sixth gate electrode layers GE5 and GE6. The semiconductor device 100d may further include the isolation layers 107, the gate capping layer 140, and the interlayer insulating layer 190.

The semiconductor device 100d may include sixth to ninth transistors 60, 70, 80, and 90 arranged around the active fins 105 and the fifth and sixth gate electrode layers GE5 and GE6, which cross each other. For example, the sixth to ninth transistors 60, 70, 80, and 90 may all be n-type MOSFETs. The sixth to ninth transistors 60, 70, 80, and 90 may be transistors to be driven under different threshold voltages from each other. In example embodiments, the semiconductor devices 100, 100a, 100b, and 100c described above with reference to FIGS. 1 to 6 may further include the semiconductor device 100d, or may further include at least one of the sixth to ninth transistors 60, 70, 80, and 90 of the semiconductor device 100d.

The sixth transistor 60 may include the second gate dielectric layer 115 and the fifth gate electrode layer GE5, and the seventh transistor 70 may include the first gate dielectric layer 114 and the fifth gate electrode layer GE5. The eighth transistor 80 may include the second gate dielectric layer 115 and the sixth gate electrode layer GE6, and the ninth transistor 90 may include the first gate dielectric layer 114 and the sixth gate electrode layer GE6. The fifth and sixth gate electrode layers GE5 and GE6 may have substantially the same width in a channel direction, i.e., in the X direction. The width may be substantially the same or similar to the first to fourth lengths L1, L2, L3, and L4 of FIG. 1. Upper surfaces of the fifth and sixth gate electrode layers GE5 and GE6 may be flat, and may be located at substantially the same height as each other.

The fifth gate electrode layer GE5 may include a sixth conductive layer 120e, the fifth conductive layer 132, and the barrier metal layer 134. The sixth gate electrode layer GE6 may include a seventh conductive layer 120f, the fifth conductive layer 132, and the barrier metal layer 134. Thicknesses of the sixth and seventh conductive layers 120e and 120f in the fifth and sixth gate electrode layers GE5 and GE6 may be different from each other. A thickness of the sixth conductive layer 120e in the fifth gate electrode layer GE5 may be lower than a thickness of the seventh conductive layer 120f in the sixth gate electrode layer GE6. The thickness of the seventh conductive layer 120f in the sixth gate electrode layer GE6 may be lower than the thickness of the sixth conductive layer 120e in the third gate electrode layer GE3 in FIG. 2A. Therefore, thicknesses of the barrier metal layers 134 in the fifth and sixth gate electrode layers GE5 and GE6 may be different from each other. Further, according to embodiments, the fifth gate electrode layer GE5 may further include the upper metal layer 136 (see FIG. 2A) on the barrier metal layer 134.

The sixth to ninth transistors 60, 70, 80, and 90 may have different threshold voltages from each other, and may thus have different operating voltages from each other. The sixth transistor 60 may have the lowest threshold voltage and operating voltage, and the seventh transistor 70 may have a threshold voltage and an operating voltage higher than those of the sixth transistor 60. The eighth transistor 80 may have a threshold voltage and an operating voltage higher than those of the seventh transistor 70, and the ninth transistor 90 may have a threshold voltage and an operating voltage higher than those of the eighth transistor 80. A difference in the threshold voltage and the operating voltage between the sixth to ninth transistors 60, 70, 80, and 90 may be due to a difference in the structure of the fifth and sixth gate electrode layers GE5 and GE6, and the first and second gate dielectric layers 114 and 115.

Figure 8:
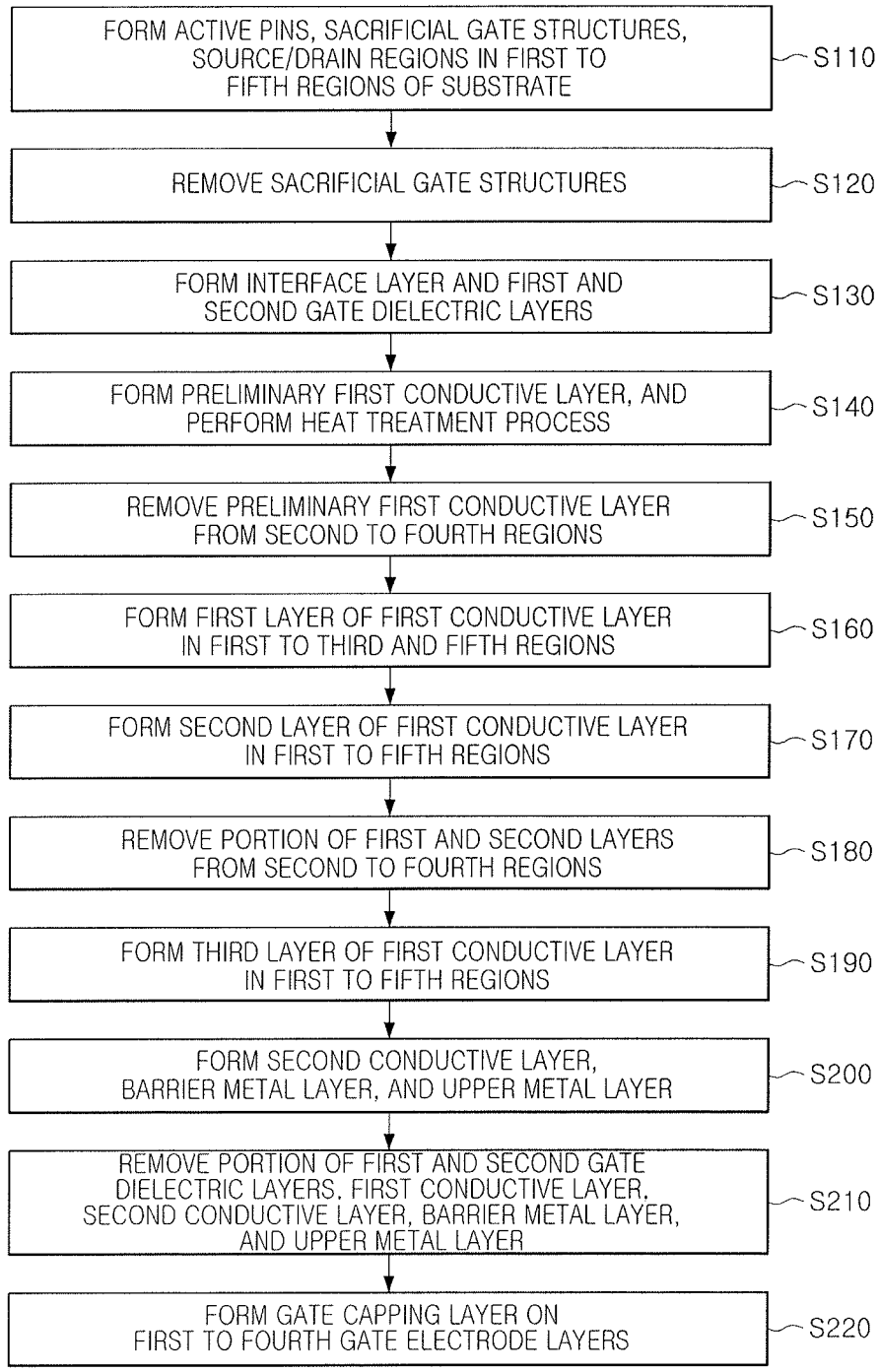
FIG. 8 illustrates a flowchart of a method of manufacturing semiconductor devices according to example embodiments.

FIG. 8 is a flowchart illustrating a method of manufacturing semiconductor devices according to example embodiments. FIGS. 9A to 9L are diagrams illustrating process operations in a method of manufacturing semiconductor devices according to example embodiments.

Figure 9A:
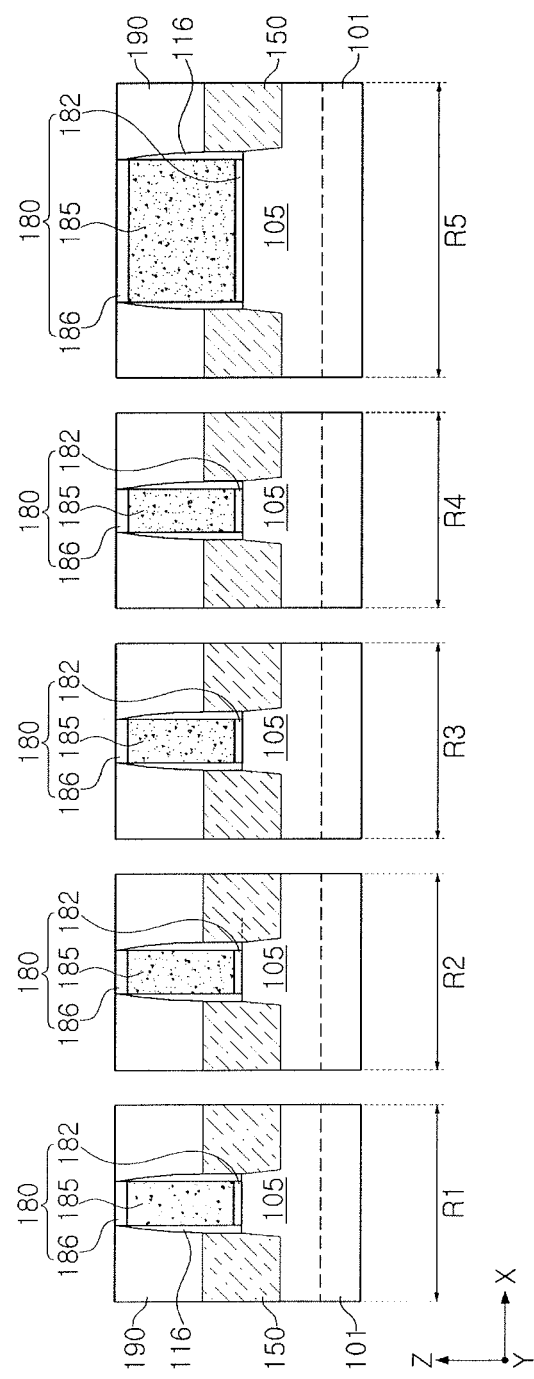
FIGS. 9A to 9L illustrate cross-sectional views of stages in a method of manufacturing semiconductor devices according to example embodiments.

Referring to FIGS. 8 and 9A, the active fins 105 may be formed by patterning the substrate 101 having the first to fifth regions R1, R2, R3, R4, and R5, followed by forming a sacrificial gate structure 180 and source/drain regions 150 on the substrate 101 (S110). Further, in this operation, the gate spacer layers 116 and the interlayer insulating layer 190 may also be formed.

The first to fifth regions R1, R2, R3, R4, and R5 may be PMOS transistor regions. The substrate 101 may include conductive regions, e.g., well structures doped with impurities. The active fins 105 may be defined by forming the isolation layers 107 (see FIG. 2B), and may have a shape protruding from the substrate 101. The active fins 105 may include impurity regions, and may include, e.g., n-type impurity regions.

The sacrificial gate structure 180 may be formed in a region in which the interface layers 112, the first and second gate dielectric layers 114 and 115, and first to fourth gate electrode layers GE1, GE2, GE3, and GE4 are disposed, by a subsequent process. The sacrificial gate structure 180 may include a sacrificial gate insulating layer 182, a sacrificial gate electrode layer 185, and a sacrificial gate capping layer 186. The sacrificial gate insulating layer 182 and the sacrificial gate capping layer 186 may be insulating layers, and the sacrificial gate electrode layer 185 may be a conductive layer, but are not limited thereto. For example, the sacrificial gate insulating layer 182 may include silicon oxide, the sacrificial gate electrode layer 185 may include polysilicon, and the sacrificial gate capping layer 186 may include at least one of silicon oxide, silicon nitride, and silicon oxynitride.

The gate spacer layers 116 may be formed on both sidewalls of the sacrificial gate structure 180. The gate spacer layers 116 may be made of a low dielectric material, and may include, e.g., at least one of SiO, SiN, SiCN, SiOC, SiON, and SiOCN.

The source/drain regions 150 may be formed on the active fins 105 recessed after removing a portion of the active fins 105 on both sides of the gate spacer layers 116. The source/drain regions 150 may be formed using, e.g., a selective epitaxial growth (SEG) process. The source/drain regions 150 may include a semiconductor material, e.g., Si, SiGe, or SiC, doped with impurities. In particular, the source/drain regions 150 may include p-type impurities. The impurities may be doped in-situ during formation of the source/drain regions 150, or may be implanted separately after growth. The source/drain regions 150 may be grown along a crystallographically stable surface in the growth process, and may have, e.g., a pentagon, a hexagon, or their similar shape as a cross-section in the Y direction, but are not limited thereto.

The interlayer insulating layer 190 may be formed by depositing an insulating material to cover the sacrificial gate structure 180 and the source/drain regions 150, and then exposing the upper surface of the sacrificial gate structure 180 through a planarization process. The interlayer insulating layer 190 may include at least one of, e.g., an oxide, a nitride, and an oxynitride, and may include a low dielectric material.

Figure 9B:
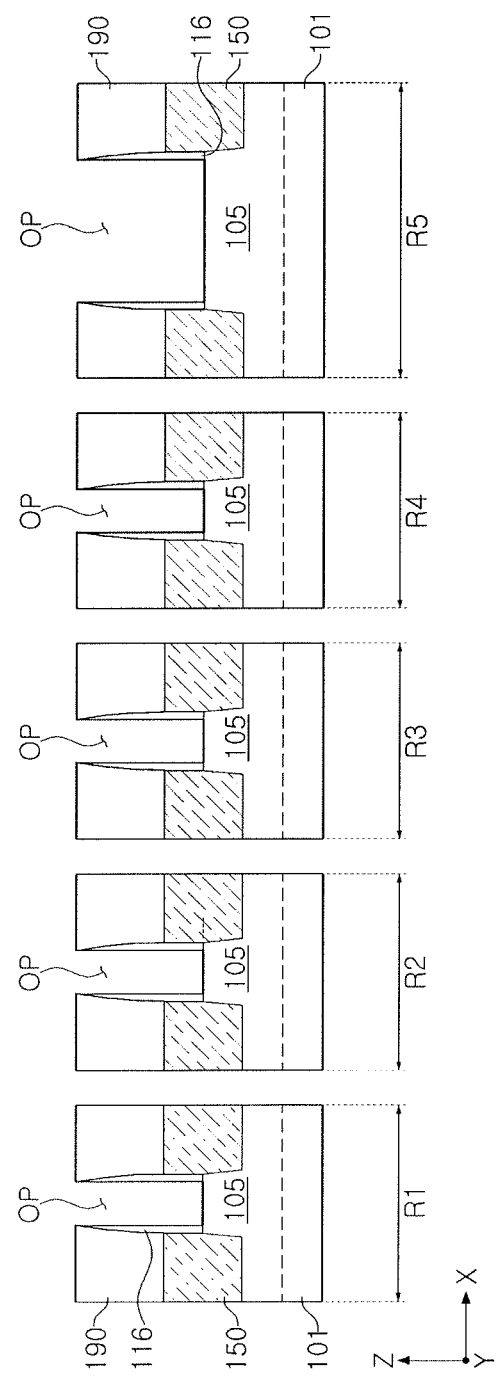

Referring to FIGS. 8 and 9B, the sacrificial gate structure 180 may be removed, thereby forming an opening OP (S120). The sacrificial gate structure 180 may be selectively removed with respect to the underlying isolation layer 107 and the active fins 105 to form the opening OP exposing the isolation layer 107, the active fins 105, and the gate spacer layers 116. The removal process of the sacrificial gate structure 180 may use at least one of a dry etching process and a wet etching process.

Figure 9C:
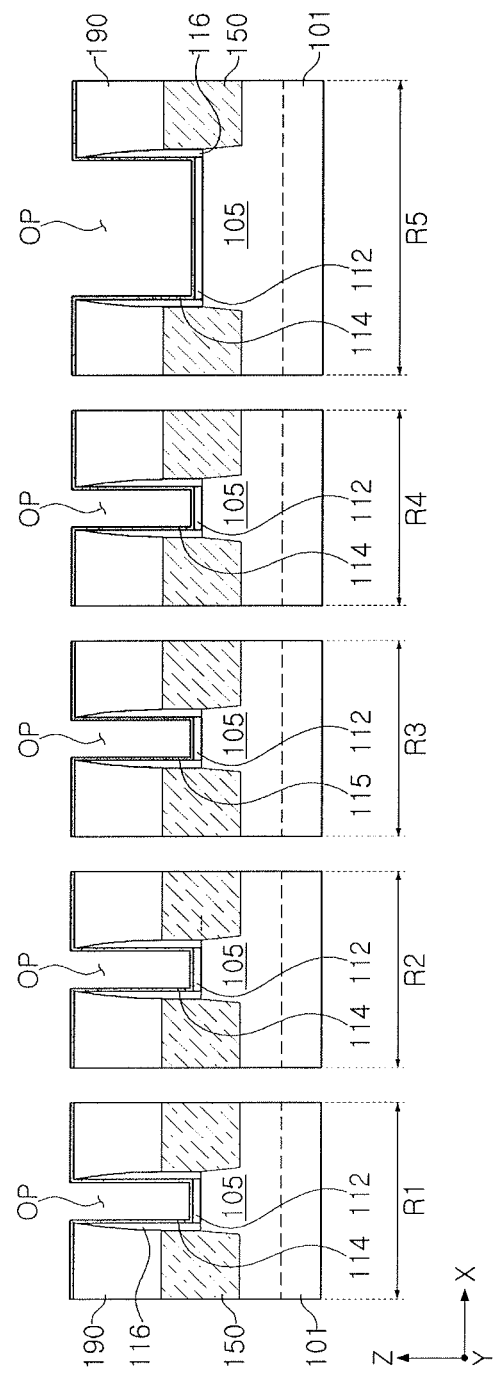

Referring to FIGS. 8 and 9C, the interface layer 112 and the first and second gate dielectric layers 114 and 115 may be formed in the opening OP (S130). The interface layer 112 and the first and second gate dielectric layers 114 and 115 may be formed to have substantially the same thickness in the first to fifth regions R1, R2, R3, R4, and R5. The interface layer 112 may be formed on the upper surface of the active fins 105 exposed to the lower surface of the opening OP. In accordance with embodiments, the interface layer 112 may be formed by oxidizing a portion of the active fins 105.

The first and second gate dielectric layers 114 and 115 may be substantially conformally formed along the sidewalls and lower surface of the opening OP. A process of forming the first gate dielectric layer 114 and a process of forming the second gate dielectric layer 115 may be performed separately. The first and second gate dielectric layers 114 and 115 may be formed using, e.g., an atomic layer deposition (ALD), a chemical vapor deposition (CVD), or a physical vapor deposition (PVD) process. The first and second gate dielectric layers 114 and 115 may include, e.g., an oxide, a nitride, or a high-k material. The second gate dielectric layer 115 may be formed to further include an element not included in the first gate dielectric layer 114. For example, the first gate dielectric layer 114 may include hafnium oxide ($HfO_2$), and the second gate dielectric layer 115 may include lanthanum hafnium oxide ($LaHf_xO_y$).

Figure 9D:
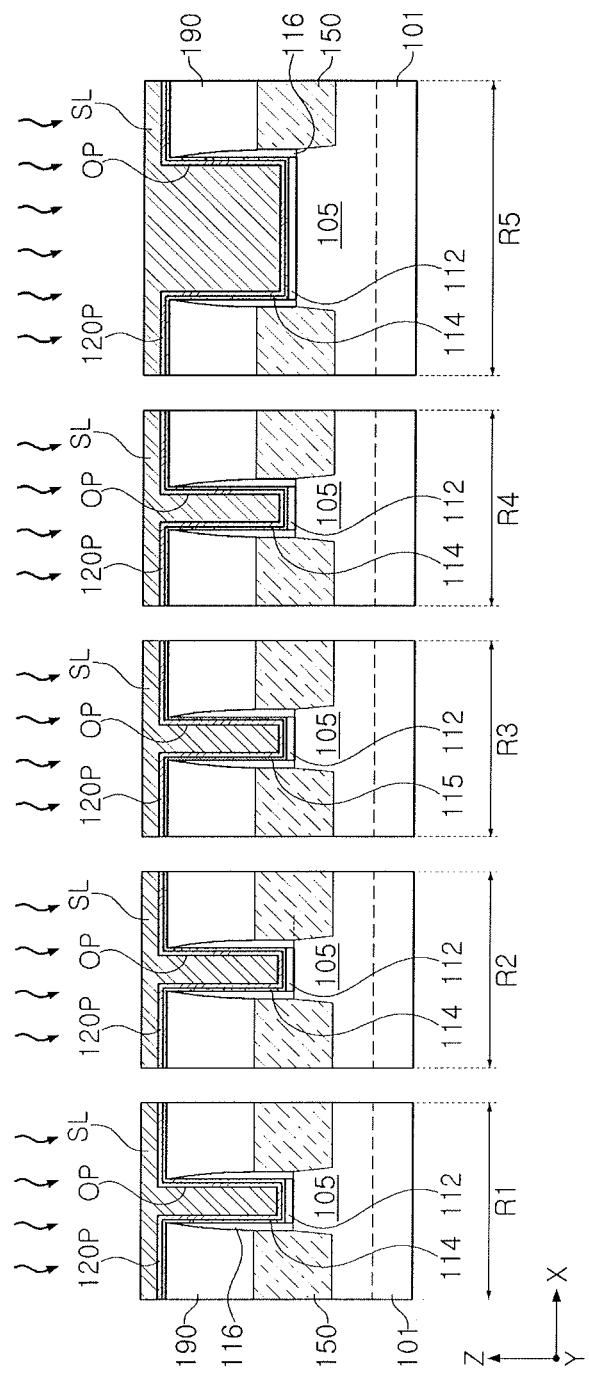

Referring to FIGS. 8 and 9D, the preliminary first conductive layer 120P and a heat treatment sacrificial layer SL may be formed in the opening OP, and a heat treatment process may then be performed (S140).

The preliminary first conductive layer 120P may be the same material as the first through fourth conductive layers 120a, 120b, 120c, and 120d formed in a subsequent process, but is not limited thereto. For example, the preliminary first conductive layer 120P may include TiN, TaN, W, WCN, or a combination thereof. The heat treatment sacrificial layer SL may be, e.g., polysilicon. A re-growth of the interface layer 112 may be prevented by forming the preliminary first conductive layer 120P and the heat treatment sacrificial layer SL, and performing a heat treatment process. Vacancies in the first and second gate dielectric layers 114 and 115 may be removed by the heat treatment process.

Figure 9E:
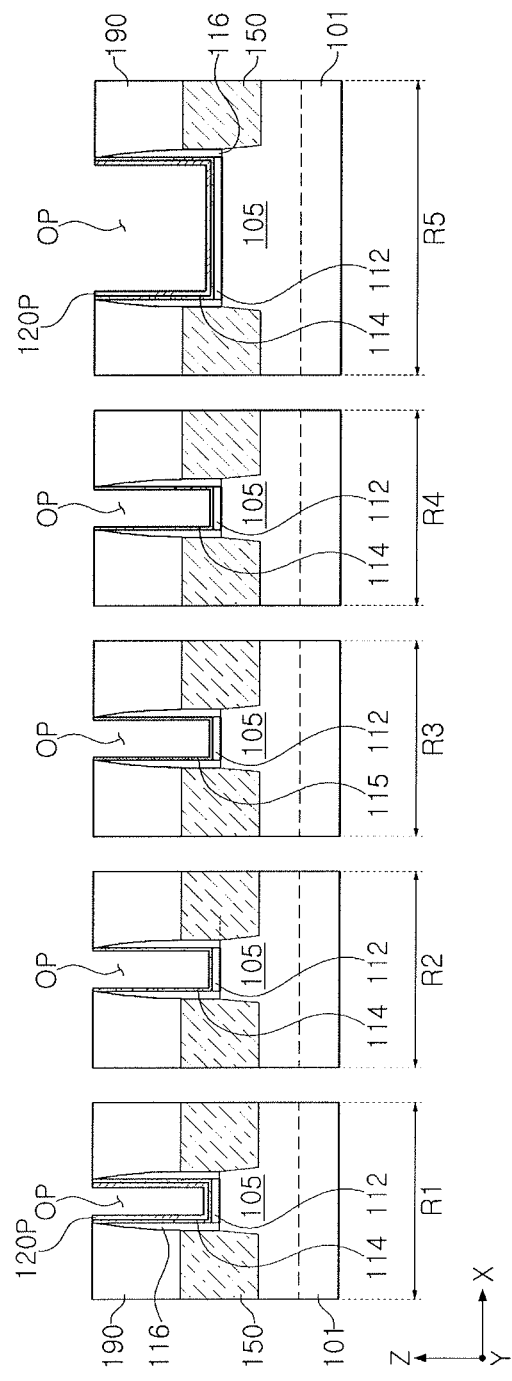

Referring to FIGS. 8 and 9E, the heat treatment sacrificial layer SL may be removed, and the preliminary first conductive layer 120P may then be removed from the second to fourth regions R2, R3, and R4 (S150).

The heat treatment sacrificial layer SL may be selectively removed with respect to the preliminary first conductive layer 120P by, e.g., a wet etching process. The preliminary first conductive layer 120P may be removed only in the second to fourth regions R2, R3, and R4, after forming a separate mask layer on the first and fifth regions R1 and R5. Therefore, the preliminary first conductive layer 120P may remain in the first and fifth regions R1 and R5.

Figure 9F:
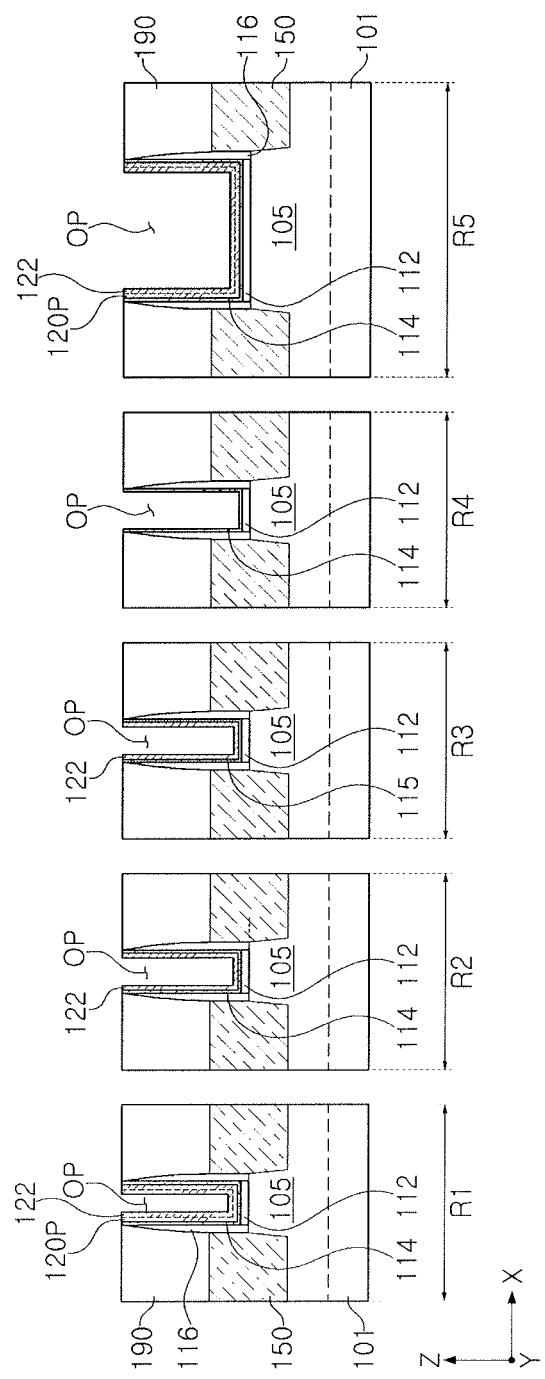

Referring to FIGS. 8 and 9F, a first layer 122 of the first, second, and fourth conductive layers 120a, 120b, and 120d may be formed in the first to third and fifth regions R1, R2, R3, and R5 (S160).

The first layer 122 may be a layer that forms a portion of the first, second, and fourth conductive layers 120a, 120b, and 120d through a subsequent process. The first to third layers 122, 124, and 126 may all be the same material, including the second and third layers 124 and 126 described below with reference to FIGS. 9G to 9I. The first through fourth conductive layers 120a, 120b, 120c, and 120d may finally be formed of at least one of the first through third layers 122, 124, and 126.

The first layer 122 may be formed entirely in the first to fifth regions R1, R2, R3, R4, and R5, and then removed only in the fourth region R4. The first layer 122 in the first and fifth regions R1 and R5 may be conformally formed on the preliminary first conductive layer 120P. The first layer 122 may be the same material as the preliminary first conductive layer 120P. In this case as well, since the preliminary first conductive layer 120P is a layer subjected to the heat treatment, a boundary between the first layer 122 and the preliminary first conductive layer 120P may be distinguished due to a difference in crystallinity and the like. The first layer 122 in the second region R2 may be conformally formed on the first gate dielectric layer 114. The first layer 122 in the third region R3 may be conformally formed on the second gate dielectric layer 115.

Figure 9G:
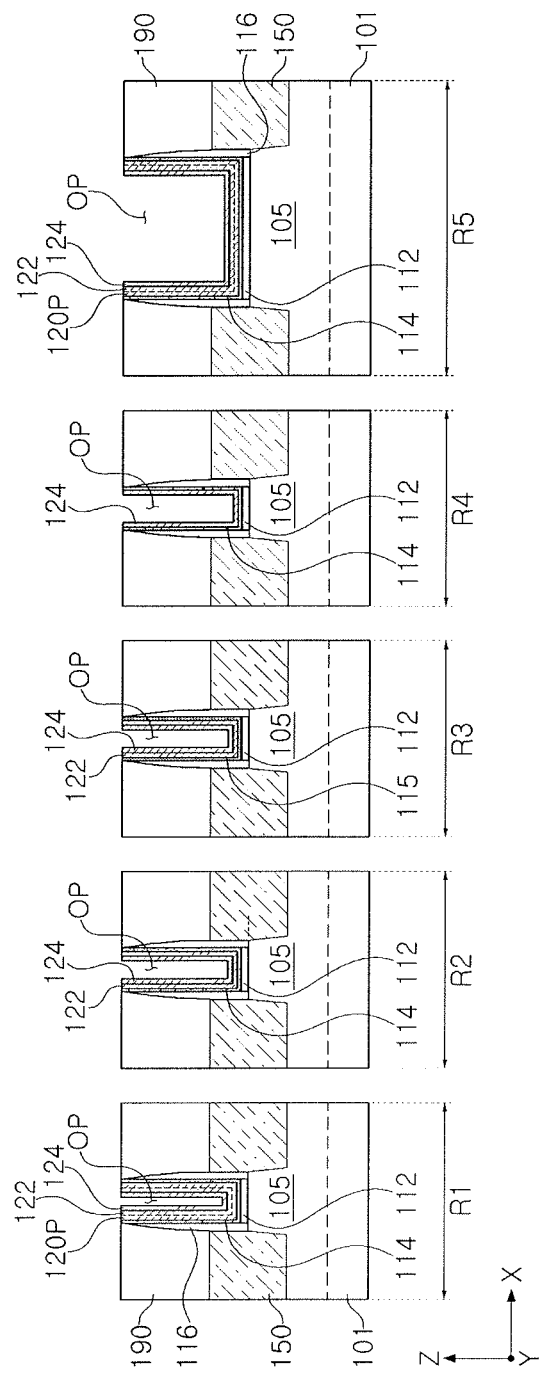

Referring to FIGS. 8 and 9G, the second layer 124 of the first through fourth conductive layers 120a, 120b, 120c, and 120d may be formed in the first to fifth regions R1, R2, R3, R4, and R5 (S170).

The second layer 124 may be a layer that forms a portion of the first through fourth conductive layers 120a, 120b, 120c, and 120d through a subsequent process. The second layer 124 may be formed entirely in the first to fifth regions R1, R2, R3, R4, and R5. The thickness of the second layer 124 may be the same as or different from the thickness of the first layer 122, but is not limited to the illustrated thickness, and may be varied in various embodiments.

The second layer 124 in the first, second, third, and fifth regions R1, R2, R3, and R5 may be conformally formed on the first layer 122. The second layer 124 may be the same material as the first layer 122, and a boundary may not be distinguished. The second layer 124 in the fourth region R4 may be conformally formed on the first gate dielectric layer 114.

Figure 9H:
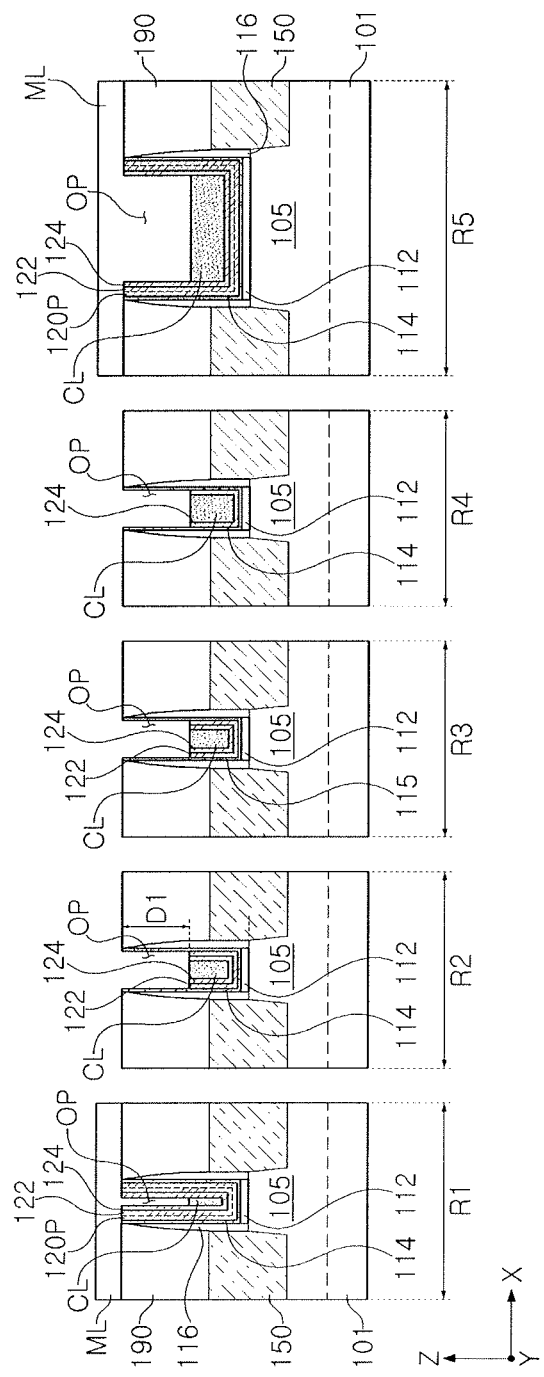

Referring to FIGS. 8 and 9H, the first and second layers 122 and 124 may be partially removed from the second to fourth regions R2, R3, and R4 (S180).

First, a coating layer CL may be formed on the second layer 124 to fill a lower portion of the opening OP to a predetermined height. The coating layer CL may include a carbonaceous material, and may be formed of, e.g., an amorphous carbon layer (ACL) or a carbon based spin-on hardmask (C—SOH) layer.

Next, a mask layer ML may be formed on the first and fifth regions R1 and R5, and the first and second layers 122 and 124 on the upper portion of the coating layer CL in the second to fourth regions R2, R3, and R4 may be removed to a first depth D1. The first depth D1 may range from about 20% to 70% of the total depth of the opening OP. The underlying first and second layers 122 and 124 covered by the coating layer CL may not be removed. The first and second layers 122 and 124 may be removed in the second and third regions R2 and R3, and the second layer 124 may be removed in the fourth region R4. Therefore, a space for gap-filling of layers to be subsequently formed in the second to fourth regions R2, R3, and R4 may be secured.

During the removal process of the first and second layers 122 and 124, the first and second gate dielectric layers 114 and 115 may remain without being removed, but is not limited thereto. According to embodiments, the first and second gate dielectric layers 114 and 115 on the upper portion of the coating layer CL may also be removed together in this operation. In this case, as described above with reference to FIG. 3B, a structure in which the upper surfaces of the first and second gate dielectric layers 114 and 115 are covered with the first conductive layers 120b and 120c through a subsequent process may be formed.

After the removal process of the first and second layers 122 and 124, the coating layer CL and the mask layer ML may be removed. The coating layer CL and the mask layer ML may be removed, e.g., by an ashing or a strip process.

Figure 9I:
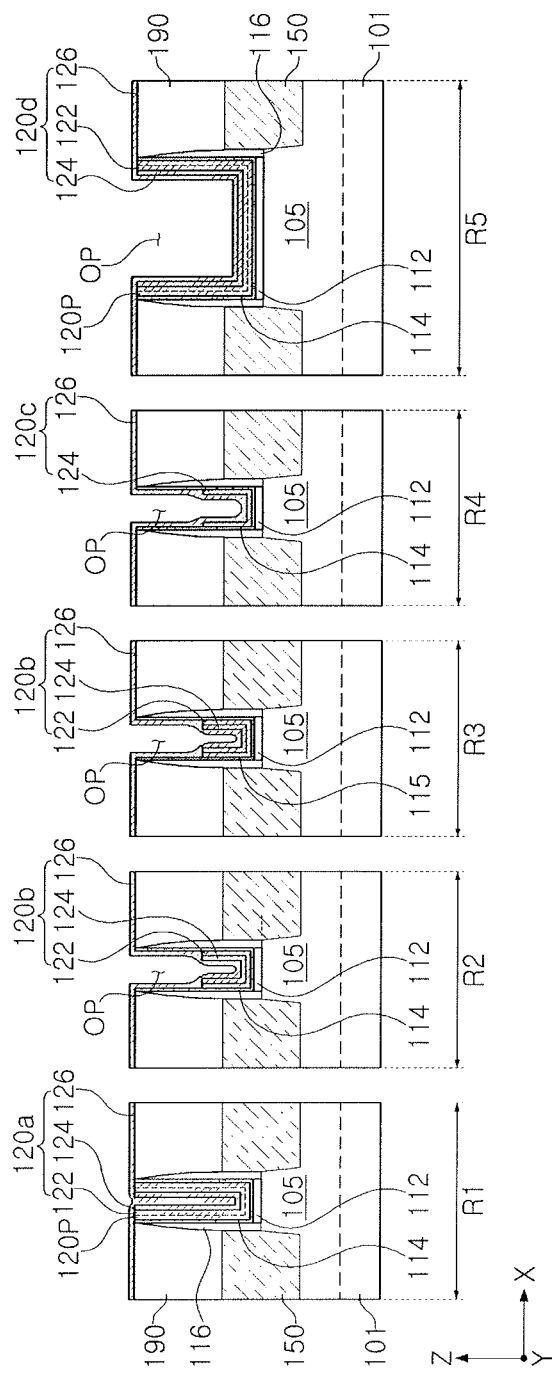

Referring to FIGS. 8 and 9I, a third layer 126 of the first through fourth conductive layers 120a, 120b, 120c, and 120d may be formed in the first to fifth regions R1, R2, R3, R4, and R5 (S190).

The third layer 126 may be a layer that forms a portion of the first conductive layers 120a, 120b, 120c, and 120d through a subsequent process. The third layer 126 may be formed on the entire first to fifth regions R1, R2, R3, R4, and R5. A thickness of the third layer 126 may be the same as or different from a thickness of the second layer 124, but is not limited to the illustrated thickness, and may be varied in various embodiments.

The third layer 126 may be the same material as the second layer 124, and the boundary may not be distinguished. In the first region R1, the third layer 126 may completely fill a space between facing surfaces of the second layer 124. For example, in the first region R1, the third layer 126 may completely fill the opening OP. In the second to fourth regions R2, R3, and R4, the third layer 126 may be conformally formed on the first and second gate dielectric layers 114, 115 and the second layer 124. In the second to fourth regions R2, R3, and R4, the third layer 126 may be formed along the first and second layers 122 and 124 having a relatively low height, and may have a curvature according to the above. In the fifth region R5, the third layer 126 may be conformally formed on the second layer 124.

The first through fourth conductive layers 120a, 120b, 120c, and 120d including at least one of the first to third layers 122, 124, and 126 may be formed in the first to fifth regions R1, R2, R3, R4, and R5, by forming the third layer 126. The first conductive layer 120a of the first region R1 may include the first to third layers 122, 124 and 126, the second conductive layer 120b of the second and third regions R2 and R3 may include the first to third layers 122, 124, and 126, the third conductive layer 120c of the fourth region R4 may include the second and third layers 124 and 126, and the fourth conductive layer 120d of the fifth region R5 may include the first to third layers 122, 124, and 126.

Figure 9J:
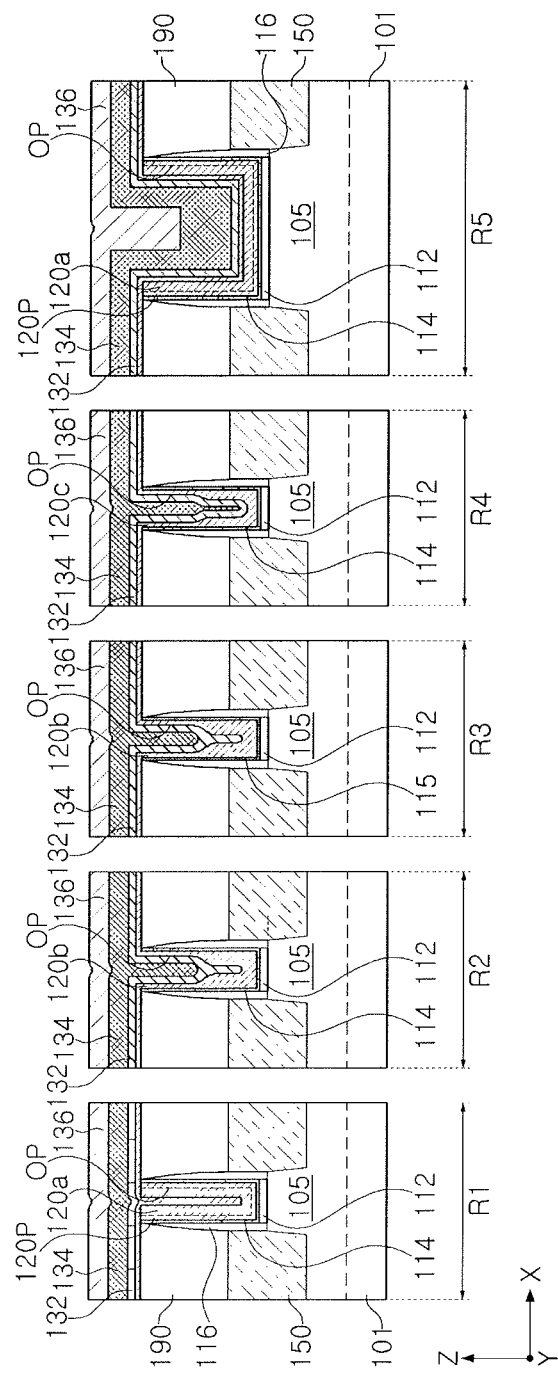

Referring to FIGS. 8 and 9J, the fifth conductive layer 132, the barrier metal layer 134, and the upper metal layer 136 may be sequentially formed on the first through fourth conductive layers 120a, 120b, 120c, and 120d (S200).

The fifth conductive layer 132 may be formed of a material having a work function lower than that of the first through fourth conductive layers 120a, 120b, 120c, and 120d. For example, the fifth conductive layer 132 may include TiAl, TiAlC, TiAlN, or combinations thereof. The barrier metal layer 134 may be made of a different material from the fifth conductive layer 132, and may include, e.g., TiN, TaN, or combinations thereof. The upper metal layer 136 may be made of a material different from the barrier metal layer 134, and may include, e.g., W or WCN.

In the first region R1, the fifth conductive layer 132, the barrier metal layer 134, and the upper metal layer 136 may be stacked above the opening OP. In the second to fourth regions R2, R3, and R4, the fifth conductive layer 132 and the barrier metal layer 134 may be formed in the opening OP, and the upper metal layer 136 may be formed above the opening OP. In the fifth region R5, the fifth conductive layer 132, the barrier metal layer 134, and the upper metal layer 136 may be formed in the opening OP.

Figure 9K:
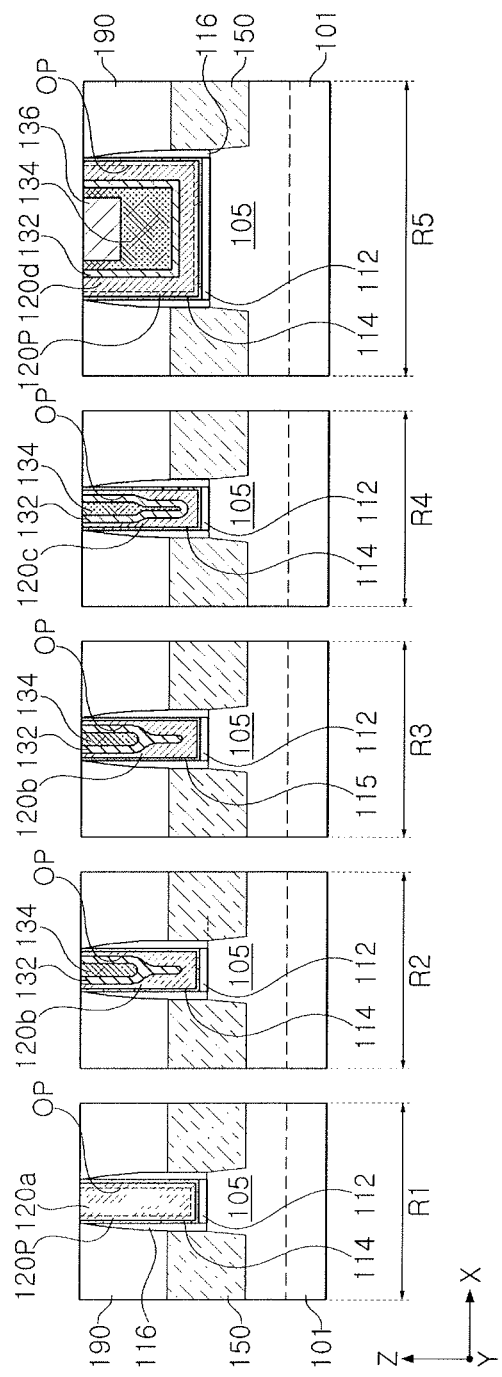

Referring to FIG. 9K, the first through fourth conductive layers 120a, 120b, 120c, and 120d, the fifth conductive layer 132, the barrier metal layer 134, and the upper metal layer 136 on the interlayer insulating layer 190 may be removed.

The removal process of the first through fourth conductive layers 120a, 120b, 120c, and 120d, the fifth conductive layer 132, the barrier metal layer 134, and the upper metal layer 136 may be performed by a chemical mechanical polishing (CMP) process. If the first gate dielectric layer 114 remains on the interlayer insulating layer 190 in the first and fifth regions R1 and R5, it may be removed together in this process. By this operation, the first through fourth conductive layers 120a, 120b, 120c, and 120d, the fifth conductive layer 132, the barrier metal layer 134, and the upper metal layer 136 in the opening OP may remain only.

Figure 9L:
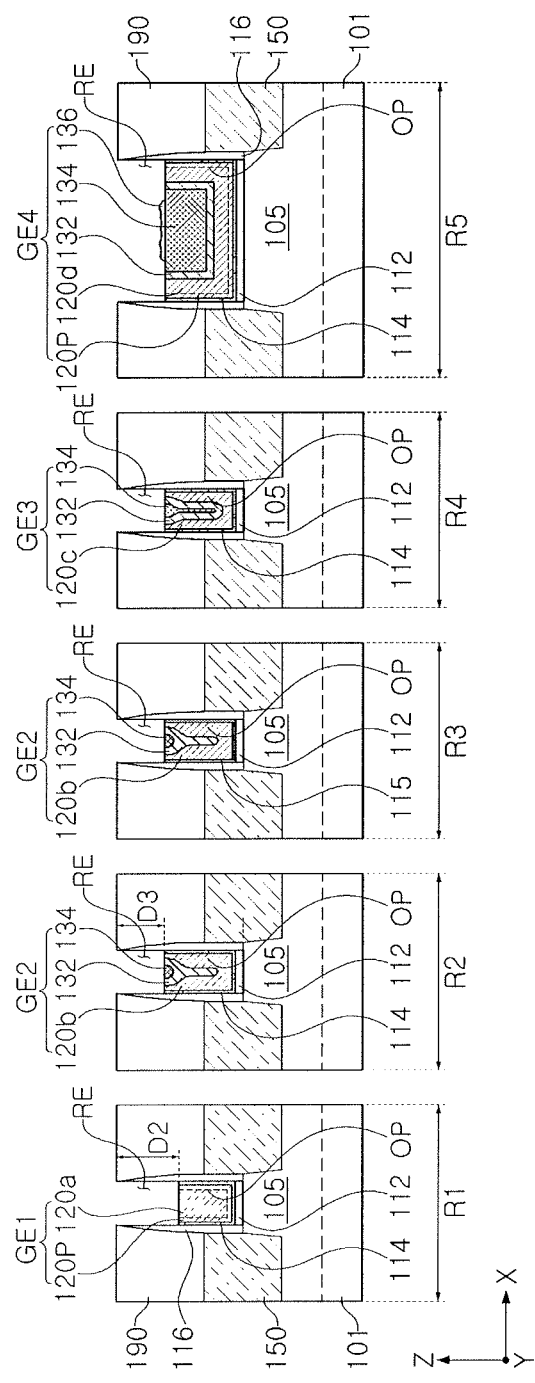

Referring to FIGS. 8 and 9L, a portion of the first and second gate dielectric layers 114 and 115, the first through fourth conductive layers 120a, 120b, 120c, and 120d, the fifth conductive layer 132, the barrier metal layer 134, and the upper metal layer 136 may be removed (S210).

The first and second gate dielectric layers 114 and 115, the first through fourth conductive layers 120a, 120b, 120c, and 120d, the fifth conductive layer 132, the barrier metal layer 134, and the upper metal layer 136 may be removed from the upper surface of the interlayer insulating layer 190 by the second and third depths D2 and D3. The first to fourth gate electrode layers GE1, GE2, GE3, and GE4 may be finally formed in the first to fifth regions R1, R2, R3, R4, and R5.

The second and third depths D2 and D3 may be shallower than the first depth D1 in FIG. 9H, but is not limited thereto. The second depth D2 of the first region R1 may be deeper than the third depth D3 of the second to fifth regions R2, R3, R4, and R5. Since only the first conductive layer 120a and the preliminary first conductive layer 120P are present in the opening OP of the first region R1, the etching rates under the specific etching conditions may be different from those in the second to fifth regions R2, R3, R4, and R5, having the fifth conductive layer 132 and the barrier metal layer 134. Accordingly, the first conductive layer 120a and the preliminary first conductive layer 120P may be recessed to the second depth D2, which is a relatively deep depth.

Next, referring to FIG. 8 together with FIG. 2A, the gate capping layer 140 filling the opening OP on the first to fourth gate electrode layers GE1 GE2. GE3, and GE4 may be formed (S220). Therefore, the first to fifth transistors 10, 20, 30, 40, and 50 may be finally formed.

Figure 10:
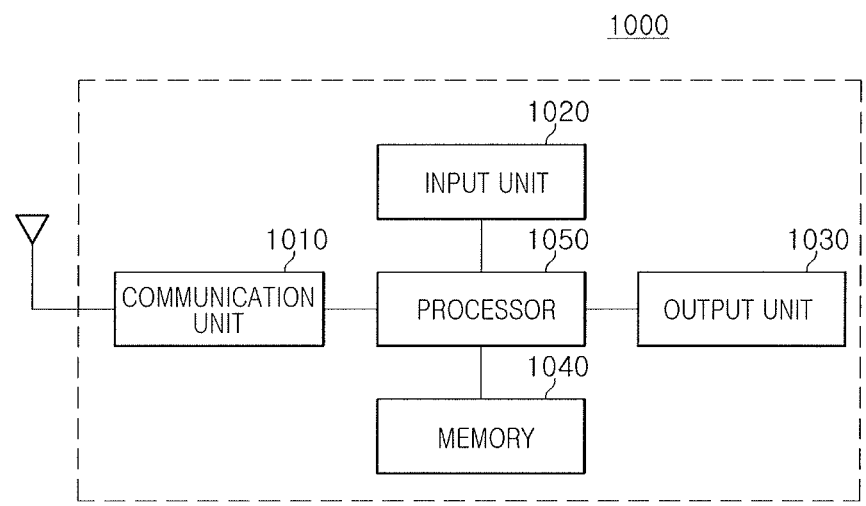
FIG. 10 illustrates a block diagram of an electronic apparatus including semiconductor devices according to example embodiments.

FIG. 10 is a block diagram illustrating an electronic apparatus including semiconductor devices according to example embodiments.

Referring to FIG. 10, an electronic device 1000 according to an embodiment may include a communication unit 1010, an input unit 1020, an output unit 1030, a memory 1040, and a processor 1050.

The communication unit 1010 may include a wired/wireless communication module, and may include a wireless internet module, a short distance communication module, a global positioning system (GPS) module, a mobile communication module, and the like. The wired/wireless communication module included in the communication unit 1010 may be connected to an external communication network to transmit and receive data, according to various communication standard standards.

The input unit 1020 may include a mechanical switch, a touch screen, a voice recognition module, and the like, as modules provided by a user to control operations of the electronic device 1000. In addition, the input unit 1020 may include a mouse that operates by a track ball or a laser pointer method, or finger mouse device, and may further include various sensor modules through which a user may input data.

The output unit 1030 may output information processed in the electronic device 1000 in a form of voice or image, and the memory 1040 may store a program or data for processing and controlling the processor 1050. The processor 1050 may transfer instructions to the memory 1040 to write or read data, according to a required operation.

The memory 1040 may be embedded in the electronic device 1000, or may communicate with the processor 1050 through a separate interface. When communicating with the processor 1050 through a separate interface, the processor 1050 may write data to, or read data from, the memory 1040 through various interface standards, e.g., secure digital (SD), secure digital high capacity (SDHC), secure digital extended capacity (SDXC), MICRO SD, universal serial bus (USB), or the like.

The processor 1050 may control operations of each portion included in the electronic device 1000. The processor 1050 may perform control and processing related to voice communication, video communication, data communication, and the like, or may also perform control and processing for multimedia reproduction and management. In addition, the processor 1050 may process input transferred from the user through the input unit 1020, and may output the result through the output unit 1030. In addition, the processor 1050 may write data necessary for controlling the operation of the electronic device 1000 in the memory 1040, or read it from the memory 1040, as described above. At least one of the processor 1050 and the memory 1040 may include a semiconductor device according to various embodiments as described above with reference to FIGS. 1 to 7.

Figure 11:
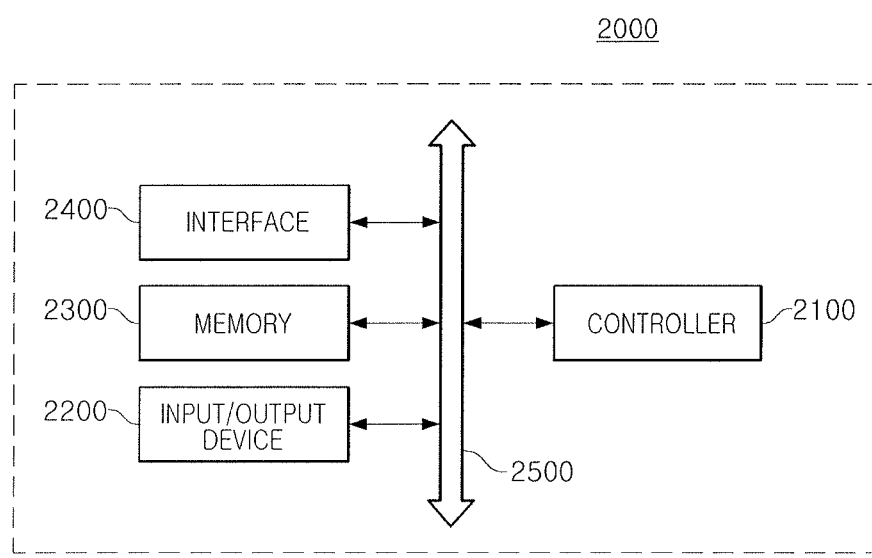
FIG. 11 illustrates a schematic diagram of a system including semiconductor devices according to example embodiments.

FIG. 11 is a schematic diagram illustrating a system including semiconductor devices according to example embodiments.

Referring to FIG. 11, a system 2000 may include a controller 2100, an input/output device 2200, a memory 2300, and an interface 2400. The system 2000 may be a mobile system, or a system that transmits or receives information. The mobile system may be a personal digital assistant (PDA), a portable computer, a web tablet, a wireless phone, a mobile phone, a digital music player, or a memory card.

The controller 2100 may execute the program, and may control the system 2000. The controller 2100 may be, e.g., a microprocessor, a digital signal processor, a microcontroller, or the like.

The input/output device 2200 may be used to input or output data of the system 2000. The system 2000 may be connected to an external device, e.g., a personal computer or network, using the input/output device 2200 to exchange data with an external device. The input/output device 2200 may be, e.g., a keypad, a keyboard, or a display.

The memory 2300 may store code and/or data for operation of the controller 2100, and/or may store data processed in the controller 2100.

The interface 2400 may be a data transfer path between the system 2000 and another external device. The controller 2100, the input/output device 2200, the memory 2300, and the interface 2400 may communicate with each other through a bus 2500.

At least one of the controller 2100 or the memory 2300 may include a semiconductor device according to various embodiments, as described above with reference to FIGS. 1 to 7.

By way of summation and review, according to embodiments of the present disclosure, semiconductor devices having improved electrical characteristics are provided. That is, structures of gate electrode layers of transistors may be varied, e.g., in each transistor, thereby providing transistors with same channel lengths but different operating voltages.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate having first, second, and third regions;
    a first gate electrode layer on the first region, and including a first conductive layer;
    a second gate electrode layer on the second region, the second gate electrode layer including:
        the first conductive layer,
        a second conductive layer on the first conductive layer, and
        a barrier metal layer on the second conductive layer, uppermost surfaces of at least the second conductive layer and the barrier metal layer being level with each other; and
    a third gate electrode layer on the third region and including the first conductive layer, the second conductive layer on the first conductive layer, and the barrier metal layer on the second conductive layer,
    wherein an uppermost surface of the first gate electrode layer is at a lower level than an uppermost surface of the second gate electrode layer, and
    wherein a thickness of the first conductive layer of the second gate electrode layer is different from a thickness of the first conductive layer of the third gate electrode layer.

2. The semiconductor device as claimed in claim 1, wherein the first gate electrode layer has a thickness smaller than a thickness of the second gate electrode layer.

3. The semiconductor device as claimed in claim 1, wherein a width of the second gate electrode layer is equal to or narrower than a width of the first gate electrode layer.

4. The semiconductor device as claimed in claim 1, wherein the first conductive layer in the first gate electrode layer has a polygonal cross-section with a flat upper surface, and the first conductive layer in the second gate electrode layer has a non-polygonal cross-section with a curved surface portion.

5. The semiconductor device as claimed in claim 1, wherein a width of an upper portion of the second conductive layer in the second gate electrode layer is wider than a width of a lower portion thereof.

6. The semiconductor device as claimed in claim 1, wherein the first conductive layer includes a material having a work function greater than a work function of the second conductive layer.

7. The semiconductor device as claimed in claim 1, further comprising a gate capping layer on the uppermost surfaces of the first and second gate electrode layers.

8. The semiconductor device as claimed in claim 7, wherein a thickness of the gate capping layer is greater on the first gate electrode layer than on the second gate electrode layer.

9. The semiconductor device as claimed in claim 1, wherein a first transistor including the first gate electrode layer and a second transistor including the second gate electrode layer are p-type MOSFETs, an operating voltage of the first transistor being lower than an operating voltage of the second transistor.

10. The semiconductor device as claimed in claim 1, wherein:
    the semiconductor device further includes first to third gate dielectric layers between each of the first to third gate electrode layers and the substrate, and
    the first gate dielectric layer and the second gate dielectric layer include a same material, the third gate dielectric layer including a material different from materials of the first and second gate dielectric layers.

11. The semiconductor device as claimed in claim 10, wherein a second transistor including the second gate electrode layer and a third transistor including the third gate electrode layer are p-type MOSFETs, an operating voltage of the second transistor being lower than an operating voltage of the third transistor.

12. A semiconductor device, comprising:
    a substrate having first, second, and third regions;
    a first gate electrode layer on the first region, and including a first conductive layer;
    a second gate electrode layer on the second region, the second gate electrode layer including:
        the first conductive layer,
        a second conductive layer on the first conductive layer, and
        a barrier metal layer on the second conductive layer, uppermost surfaces of at least the second conductive layer and the barrier metal layer being level with each other; and
    a third gate electrode layer on the third region and including the first conductive layer, the second conductive layer on the first conductive layer, the barrier metal layer on the second conductive layer, and an upper metal layer on the barrier metal layer,
    wherein an uppermost surface of the first gate electrode layer is at a lower level than an uppermost surface of the second gate electrode layer, and
    wherein a width of the third gate electrode layer is wider than a width of the first gate electrode layer.

13. The semiconductor device as claimed in claim 12, wherein first to third transistors including the first to third gate electrode layers, respectively, are p-type MOSFETs.

14. A semiconductor device, comprising:
    a substrate having first, second, and third regions;
    a first gate electrode layer on the first region, and including a first conductive layer;

a second gate electrode layer on the second region, the second gate electrode layer including:
  the first conductive layer,
  a second conductive layer on the first conductive layer, and
  a barrier metal layer on the second conductive layer, uppermost surfaces of at least the second conductive layer and the barrier metal layer being level with each other; and
a third gate electrode layer on the third region and including the second conductive layer and the barrier metal layer on the second conductive layer,
wherein first and second transistors including the first and second gate electrode layers, respectively, are p-type MOSFETs, and a third transistor including the third gate electrode layer is an n-type MOSFET.

15. The semiconductor device as claimed in claim 1, wherein the first conductive layer in the first gate electrode layer includes two layers including a same material and having different crystallinity.

\* \* \* \* \*